US006627552B1

United States Patent
Nishio et al.

(10) Patent No.: US 6,627,552 B1
(45) Date of Patent: Sep. 30, 2003

(54) METHOD FOR PREPARING EPITAXIAL-SUBSTRATE AND METHOD FOR MANUFACTURING SEMICONDUCTOR DEVICE EMPLOYING THE SAME

(75) Inventors: Johji Nishio, Tokyo (JP); Masayuki Ishikawa, Kanagawa (JP)

(73) Assignee: Kabsuhiki Kaisha Toshiba, Kawasaki (JP)

( * ) Notice: Subject to any disclaimer, the term of this patent is extended or adjusted under 35 U.S.C. 154(b) by 29 days.

(21) Appl. No.: 09/818,843

(22) Filed: Mar. 28, 2001

(30) Foreign Application Priority Data

Mar. 29, 2000 (JP) .......................... 2000-090158
Sep. 29, 2000 (JP) .......................... 2000-301301

(51) Int. Cl.[7] ...................... H01L 21/311; C30B 33/00; C30B 23/02
(52) U.S. Cl. .................. 438/694; 117/3; 117/87
(58) Field of Search .................. 117/915, 3, 87, 117/88; 438/694

(56) References Cited

U.S. PATENT DOCUMENTS

| | | | | |
|---|---|---|---|---|
| 5,620,557 A | * | 4/1997 | Manabe et al. ............. | 438/507 |
| 5,679,152 A | * | 10/1997 | Tischler et al. ............. | 117/97 |
| 5,903,017 A | | 5/1999 | Itaya et al. | |
| 5,932,896 A | | 8/1999 | Sugiura et al. | |
| 5,987,048 A | | 11/1999 | Ishikawa et al. | |
| 6,118,801 A | | 9/2000 | Ishikawa et al. | |
| 6,121,634 A | | 9/2000 | Saito et al. | |
| 6,146,457 A | * | 11/2000 | Solomon .................. | 117/90 |
| 6,147,364 A | | 11/2000 | Itaya et al. | |
| 6,176,925 B1 | * | 1/2001 | Solomon et al. ............. | 117/89 |
| 6,177,292 B1 | * | 1/2001 | Hong et al. ................. | 438/46 |
| 6,204,084 B1 | | 3/2001 | Sugiura et al. | |
| 6,207,005 B1 | * | 3/2001 | Henley et al. ............... | 156/345 |
| 6,210,479 B1 | * | 4/2001 | Bojarczuk et al. ............ | 117/84 |
| 6,214,701 B1 | * | 4/2001 | Matsushita et al. ........... | 438/458 |
| 6,280,523 B1 | * | 8/2001 | Coman et al. ............... | 117/101 |
| 6,284,631 B1 | * | 9/2001 | Henley et al. .............. | 438/526 |
| 6,328,796 B1 | * | 12/2001 | Kub et al. .................. | 117/94 |
| 6,458,672 B1 | * | 10/2002 | Henley et al. .............. | 438/478 |

FOREIGN PATENT DOCUMENTS

| | | |
|---|---|---|
| JP | 2-229476 | 9/1990 |
| JP | 4-297023 | 10/1992 |

OTHER PUBLICATIONS

H. Amano, et al., Appl. Phys. Lett. vol. 48, No. 5, pp. 353–355, "Metalogranic Vapor Phase Epitaxial Growth of a High Quality GaN Film Using an AIN Buffer Layer," Feb. 3, 1986.

(List continued on next page.)

*Primary Examiner*—Benjamin L. Utech
*Assistant Examiner*—Matthew Anderson
(74) *Attorney, Agent, or Firm*—Oblon, Spivak, McClelland, Maier & Neustadt, P.C.

(57) ABSTRACT

The present invention provides a method for preparing epitaxial-substrate, for growing a multilayered structure of GaN based semiconductor layers on the epitaxial-substrate so as to construct a semiconductor device such as blue-emitting laser diode and LED. The method for preparing the epitaxial-substrate encompasses (a) growing a first GaN based semiconductor layer on a bulk-substrate; (b) growing an InGaN based semiconductor layer on the first GaN based semiconductor layer; (c) growing a second GaN based semiconductor layer on the InGaN based semiconductor layer; and (d) separating the second GaN based semiconductor layer from the first GaN based semiconductor layer to provide the epitaxial-substrate. The epitaxial-substrate having a high crystallographic perfection and an excellent surface morphology is obtained simply and in a short time. The defect density of the single crystalline GaN based semiconductor layer film grown on the epitaxial-substrate is greatly reduced.

24 Claims, 12 Drawing Sheets

OTHER PUBLICATIONS

S. Nakamura, Japanese Journey of Applied Physics, vol. 30, No. 10A, pp. L 1705–L 1707, "GaN Growth Using GaN Buffer Layer," Oct. 1991.

Shuji Nakamura, et al.; "InGaN–Based Multi–Quantum–Well–Structure Laser Diodes"; Jpn. J. Appl. Phys., vol. 35, 1996, pp. L74–L76.

* cited by examiner

METHOD FOR PREPARING EPITAXIAL-SUBSTRATE AND METHOD FOR MANUFACTURING SEMICONDUCTOR DEVICE EMPLOYING THE SAME

BACKGROUND OF THE INVENTION

1. Field of the Invention

The present invention pertains to a vapor phase epitaxial growth technology of a single crystalline gallium nitride (GaN) based compound semiconductor, more particularly to a method of fabricating a single crystalline substrate (wafer) of GaN based compound semiconductor (hereinafter referred as "the GaN based semiconductor") having an excellent crystallographic quality and to a method of manufacturing a semiconductor device using this single crystalline wafer of GaN based semiconductor.

2. Description of the Related Art

Recently, blue light emitting semiconductor devices and electronic devices using a single crystalline GaN based semiconductor as a material are attracting attention. A metalorganic compound chemical vapor deposition method (hereafter referred as "the MOCVD method") is well known as a method of growing crystalline GaN based semiconductor. The MOCVD method is one of the epitaxial growth methods with which a single crystalline compound semiconductor layer is grown on a substrate by supplying a gaseous metalorganic compound (hereafter referred as "the MO gas") with ammonia ($NH_3$) gas as reaction gases (source gases) into a reaction chamber in which the substrate is located. In the case of growing, for example, GaN epitaxial layer, trimethylgallium (TMG), which is a MO gas as a group III gas, and $NH_3$ gas as a group V gas are often used.

In order to manufacture semiconductor devices using the GaN based semiconductor crystals grown in this manner, noticeable improvement of crystallographic quality of the epitaxially grown layers is indispensable to improve the performance of the semiconductor devices.

The surface of, for example, a GaN layer grown directly on a sapphire ($Al_2O_3$) substrate by the MOCVD method has faults and the surface morphology is very poor due to the formation of hexagonal pyramid-like or hexagonal shaped patterns resulting in numerous irregularities on the surface. Manufacturing of semiconductor device such as a blue light emitting diode (hereafter referred as "the LED") using the semiconductor crystalline layer having very poor surface morphology such that the numerous irregularities are present is practically impossible due to very low yield.

In order to solve these problems, there is proposed a method of growing a buffer layer of aluminum nitride (AlN) on the substrate before growing the GaN based semiconductor crystal fin (refer to *Physics Letter vol.* 48, 1986, p.353 and Japanese patent under provisional publication No.1990-229476) and a method of growing a buffer layer of GaN (refer to *Japanese Journal of Applied Physics Vol.* 30, 1991, pL1715 and Japanese patent under provisional publication No. 1992-297023). According to these method, a buffer layer of 10–120 nm in thickness is formed on the sapphire substrate at low temperature of 400–900° C. These methods indicate a capability of improvement of the crystallographic quality and the surface morphology of the GaN semiconductor layer by growing GaN layer on the buffer layer.

However, the method described above is required to control very small quantity of feed gas, because the growing condition of buffer layer is limited strictly and further, because the film thickness must be controlled very accurately and strictly. The control of epitaxial growth does not accompany many difficulties when MO gas such as TMG gas is used as a Ga source. However, when gallium chloride (GaCl) formed by supplying hydrogen chloride (HCl) gas so as to contact with liquid gallium is used, the control range of feed quantity is much higher than that for the case of using MO gas, so that the control performance and the reproducibility are extremely low. In the case of obtaining a thick single crystalline GaN based semiconductor layer, the gas supply system of GaCl mentioned above is commonly used. One of the largest advantages is a cost of the raw material. There is a trial balance indicating that the cost of raw material can be lowered by two to three orders compared with MOCVD method. However, it is difficult to improve crystal quality and surface morphology of a laminated structure of the GaN based semiconductor formed on the thick single crystalline GaN based semiconductor layer grown by this method. Furthermore, the crystal quality and the surface morphology are not sufficiently good to fabricate a practical semiconductor laser diode, so that a noticeable improvement of the crystal quality is required. Especially, it is well known that the existence of large crystal defect called "nanopipe" is a large problem in an improvement of semiconductor device particularly in reliability.

In the conventional light emitting device using a single crystalline GaN based semiconductor layer, because the sapphire substrate popularly employed for the epitaxial growth was insulating, it was not possible to dispose the electrode layer on the back surface. Hence, it is necessary to form anode and cathode electrodes on a same side of the surfaces, by exposing both n- and p-GaN based semiconductor layers, digging a trench for disposing one of the electrodes to the required contact layer. The electrode forms an ohmic contact electrode with a semiconductor layer appeared at the bottom of the trench. Not only a process of trench formation for disposing the electrode but also processes of wire bonding onto both of these two electrodes were required. In particular, since the GaN based semiconductor is a material difficult to etch, the formation of trench for forming the electrode is difficult and the fabrication processes are complicated. As the region of the trench for disposing the electrode occupied a certain area, the entire size could not be made small and so the yield was low. Such a difficulty was a serious problem especially in integrated structures.

SUMMARY OF THE INVENTION

The present invention is made in consideration of these circumstances and has an object to provide a method for preparing simply and in short time a substrate for epitaxial growth (hereinafter referred as "the epitaxial-substrate") of a crystal having high crystallographic perfection and excellent surface morphology.

Another object of the present invention is to provide a method of manufacturing a semiconductor device wherein the electrical and optical behaviors are remarkably improved.

In order to achieve above-mentioned objects, first feature of the present invention lies in a method for preparing an epitaxial-substrate encompassing:

(a) growing epitaxially a first GaN based semiconductor layer on a bulk crystalline substrate (first process);

(b) growing epitaxially a GaN based semiconductor layer containing indium (hereinafter referred as "the InGaN based semiconductor layer") on the first GaN based semiconductor layer (second process);

(c) growing epitaxially a second GaN based semiconductor layer on the InGaN based semiconductor layer (third process); and (d) separating the second GaN based semiconductor layer from the first GaN based semiconductor layer and provides the epitaxial-substrate (fourth process).

Here, "the bulk crystalline substrate" indicates a substrate such as the sapphire substrate, obtained from an ingot, or the bulk crystal, grown by a melt growth or a solution growth, by cutting down using a diamond blade and polishing into a geometry of "a wafer" having a required thickness (for example, about a thickness of 100 to 300 $\mu$m). The bulk crystalline substrate may be referred as "the bulk-substrate" hereinafter. According to the first feature of the present invention, an epitaxial-substrate having a high crystallographic perfection and an excellent surface morphology can be obtained simply and in a short time. For example, the defect density of the single crystalline GaN based semiconductor layer grown on the epitaxial-substrate is greatly reduced.

Second feature of the present invention inheres in a method of manufacturing a semiconductor device encompassing:

(a) growing epitaxially a first GaN based semiconductor layer on a bulk-substrate (first process);

(b) growing epitaxially an InGaN based semiconductor layer on the first GaN based semiconductor layer (second process);

(c) growing epitaxially a second GaN based semiconductor layer on the InGaN based semiconductor layer (third process);

(d) separating the second GaN based semiconductor layer from the bulk-substrate so as to obtain an epitaxial-substrate (fourth process);

(e) growing epitaxially a multilayered structure of single crystalline GaN based semiconductor layers on the epitaxial-substrate (fifth process);

(f) forming an electrode on the uppermost layer of multilayered structure (sixth process).

The first to fourth processes of the method of manufacturing the semiconductor device according to the second feature of the present invention are the same as the method for preparing the epitaxial-substrate according to the first feature described above, i.e. the semiconductor device is manufactured by adding the fifth and the sixth processes to the process sequence of the first feature. And the semiconductor device encompasses a stacked structure grown on the epitaxial-substrate obtained by the method according to the first feature. In the semiconductor device fabricated by the method of manufacturing the semiconductor device according to the second feature of the present invention, a significant improvement of the electrical and light emitting characteristics are obtained. Further, the operation lifetime of the light emitting device are improved. And, semiconductor devices with high yield can be easily manufactured as the manufacturing process is simplified.

DETAILED DESCRIPTION OF THE INVENTION

Figure 1:
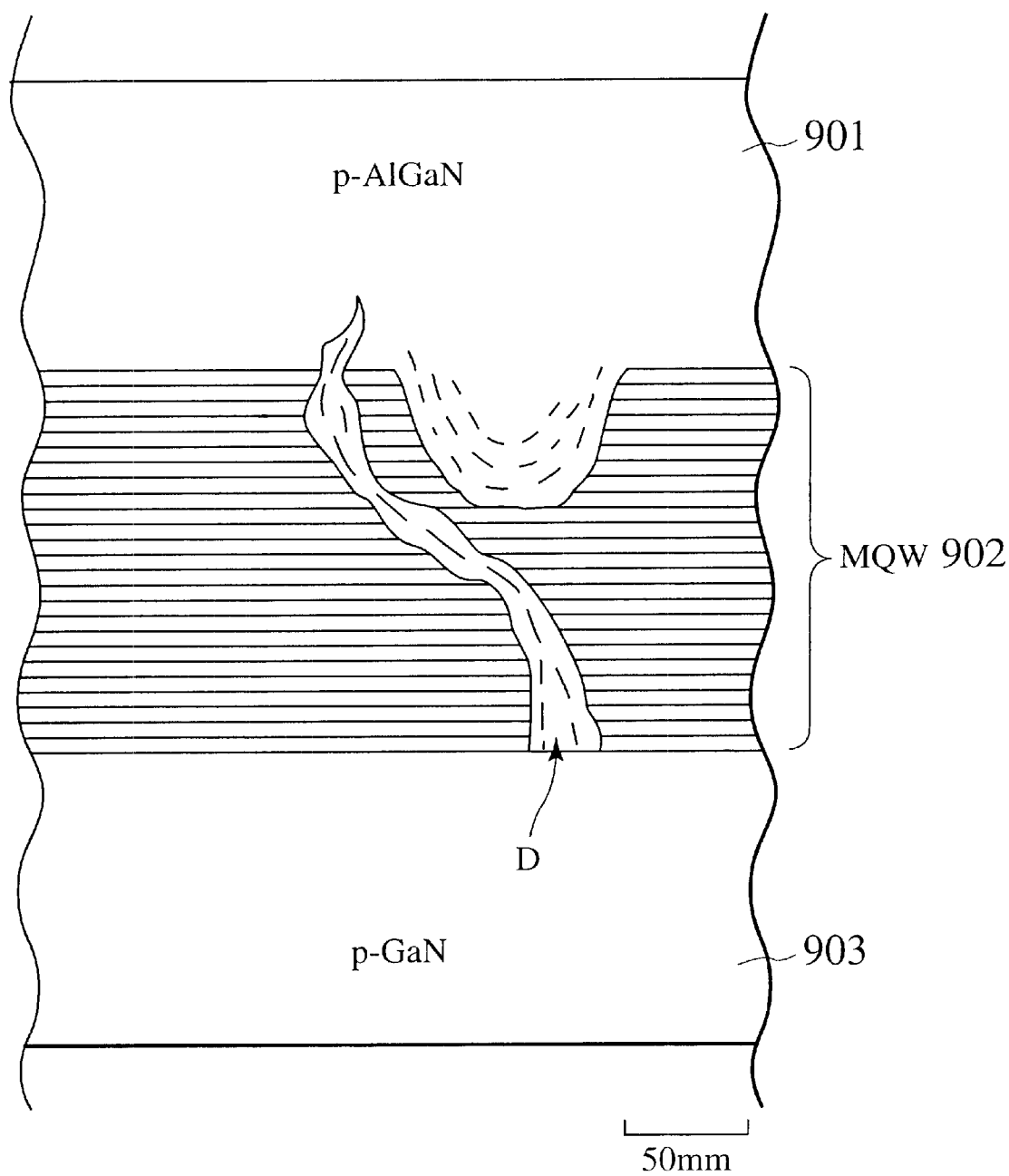
FIG. 1 is a brief sketch of an image of a cross sectional view taken by a transmission electron microscope (TEM) in the vicinity e of the multi-quantum well (MQW) active layer of a semiconductor laser diode by a conventional fabrication method of a semiconductor device.

Though the GaN bulk substrate, or the substrate obtained from the bulk single crystal of GaN, may be the ideal substrate for an epitaxial growth of a single crystalline GaN based semiconductor layer, an excellent GaN bulk substrate is not commercially available, because an excellent single crystal of the GaN, or GaN based semiconductor has not yet been obtained in the state of art. Hence, the bulk-substrates such as a sapphire substrate, 6H-silicon carbide (SiC), 3C—SiC, zinc oxide (ZnO) and magnesium oxide (MgO) and another materials are used as the substrates for the epitaxial growth of the single crystalline GaN based semiconductor layer. For example, the sapphire substrate as one of the examples of the bulk-substrate are grown by following methods:

(a) a pulling method wherein a seed crystal is dipped into a melt in a crucible, and then pulled up vertically while rotating the crystal;

(b) a capillary method wherein a seed crystal is joined into a melt raised by the capillarity, and then pulled up while controlling the crystal geometry at the upper edge;

(c) a flame fusion method wherein finely powdered raw material is melted in an oxyhydrogen flame and accumulated on a seed crystal located at a refractory bar to be grown to a single crystal; and (d) a heat exchanger method wherein a seed crystal is put at a center of the bottom portion of a crucible located on a heat exchanger, and the raw material is heated to melt while cooling the seed crystal and then cooled slowly to be grown to a single crystal.

By the method for preparing the epitaxial-substrate according to the above-mentioned first feature of the present invention, micro-holes formed in the first GaN based semiconductor layer by the first process are filled up and planarized in the second and the third processes of the first feature so that the epitaxial-substrate having fine surface morphology and crystallographic perfection can be obtained. Accordingly, the defect density in the single crystalline GaN based semiconductor layer grown on the epitaxial-substrate can be reduced.

In the method for preparing the epitaxial-substrate according to the above-mentioned first feature of the present invention, it is desirable that a MO gas is used for the gallium source in the first process and a halide of gallium metal is used for that in the third process. Besides TMG gas described at the beginning, triethylgallium (TEG) and another MO compound gases may be used as the MO gas for gallium source. Namely, the first process can be carried out by the MOCVD method with relatively low growth rate. And the third process by halogen transport vapor phase epitaxial growth method (hereinafter referred as "the VPE method") can be executed with high growth rate. As a halogen transport VPE method, a chloride transport VPE method using, for example, Ga—HCl—$NH_3$ system can be used. Typically, the MOCVD method with the growth rate of about 2 $\mu$m/h as the first process and the halogen transport VPE method with a high growth rate of about 10 to 60 $\mu$m/h as the third process may be employed in the following embodiments. In this way, the first GaN based semiconductor layer is grown epitaxially with relatively low growth rate and the second GaN based semiconductor layer is formed thereon by the high speed epitaxial growth, and thus the micro-holes formed initially are filled up, and the surface is planarized. Therefore, the epitaxial-substrate having a desired thickness of about 30 to 500 $\mu$m, preferably, about 30 to 300 $\mu$m, an excellent surface morphology and a high crystallographic perfection can be obtained in a short time. More preferably, thickness of the epitaxial-substrate is about 50 to 200 $\mu$m, because of possible problems on mechanical strength and difficulty of handling for the thickness of 30 $\mu$m or less. Thickness more than 500 $\mu$m of the epitaxial-substrate may be unpractical because of the longer growing time resulting in the lower productivity, although it may possible to obtain the thicker epitaxial-substrate. When thickness of the epitaxial-substrate is increased, the electrical resistance and the carrier transit time of the substrate come into question depending on the object of the semiconductor device. Hence, the thickness of about 300 $\mu$m may be desirable in general. In the case of manufacturing of a high speed device, the thickness of the epitaxial-substrate may be desired to be relatively thin, such as about 80 $\mu$m to 100 $\mu$m.

By the fourth process mentioned above in the method for preparing the epitaxial-substrate related to the first feature of the present invention, it is possible to remove at least part of the single crystalline InGaN based semiconductor layer by vapor phase etching, or by "the gas etching", and thereafter separate the second GaN based semiconductor layer from the portion of the single crystalline InGaN based semiconductor layer by the stress due to the thermal strain. In this way, as the epitaxial-substrate can be separated easily by thermal strain, it is not necessary to polish the substrate even when a hard sapphire substrate is used as the starting bulk-substrate. Namely, an epitaxial-substrate can be obtained in much shorter time more than that in the case of obtaining the substrate by polishing the bulk-substrate such as sapphire substrate, and the productivity becomes high.

Besides the MOCVD method described above, other VPE methods can be employed for the fifth process of the epitaxial growth in the above-mentioned second feature of the present invention. That is, several epitaxial technologies such as molecular beam epitaxy (MBE), chemical beam epitaxy (CBE), atomic layer epitaxy (ALE) and molecular layer epitaxy (MLE) are also adaptable to the fifth process in the above-mentioned second feature.

The epitaxial-substrate of the present invention has excellent surface morphology and perfection of crystallographic quality as described in the first feature of the present invention. Hence, defect density in the single crystalline GaN based semiconductor layer grown by the fifth process on the epitaxial-substrate is significantly reduced. For example, a single crystalline GaN based semiconductor layer with the dislocation density of about $1 \times 10^5 cm^{-2}$, the value of which is two orders lower than that for conventional technology can be obtained.

Obviating the insulating bulk-substrate such as the sapphire substrate but an epitaxial-substrate with low resistivity is used for the method of manufacturing a semiconductor device according to the second feature of the present invention. Accordingly, it is also possible to make a splendid ohmic contact between a metal electrode and the back surface of the epitaxial-substrate with low resistivity (high impurity concentration).

The semiconductor device according to the second feature of the present invention can be applied to various semiconductor devices such as a semiconductor light-emitting device, for example, a semiconductor laser diode (hereinafter referred as "the LD") and a LED. Furthermore, the semiconductor device according to the second feature can also be applied to various semiconductor electronic devices such as a high electron mobility transistor (HEMT), a Schottky gate field effect transistor (MESFET), a metal-insulator-semiconductor field effect transistor (MISFET), a heterojunction bipolar transistor (HBT) and a static induction transistor (SIT). When the semiconductor device according to the present invention is a blue-emitting LED, the emission intensity will be far increased. Furthermore, the direct ohmic contact of a metal electrode to the back surface of the epitaxial-substrate obviates the necessity of the etching process for forming the electrode, and only single wire bonding is needed for one light emitting device. As a result, the manufacturing process is greatly simplified and the productivity is improved. Especially, a lifetime of the LD during a continuous wave (CW) oscillation at room temperature is far increased due to the excellent crystallographic perfection.

DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following description specific details are set fourth, such as specific MO gas, specific materials, specific process and specific equipment in order to provide thorough understanding of the present invention. It will be apparent, however, to one skilled in the art that the present invention may be practiced without these specific details. In other instances, well-known manufacturing materials, process and equipment are not set fourth in detail in order not unnecessary obscure the present invention.

First, examples of the structure of VPE equipments used in the fabrication of the epitaxial-substrates of the present invention and methods for preparing the epitaxial-substrates will be described. Thereafter, examples of methods of manufacturing semiconductor devices using the epitaxial-substrate will be described in the first to third embodiments.

Chloride-MOCVD Equipment

Figure 2A:
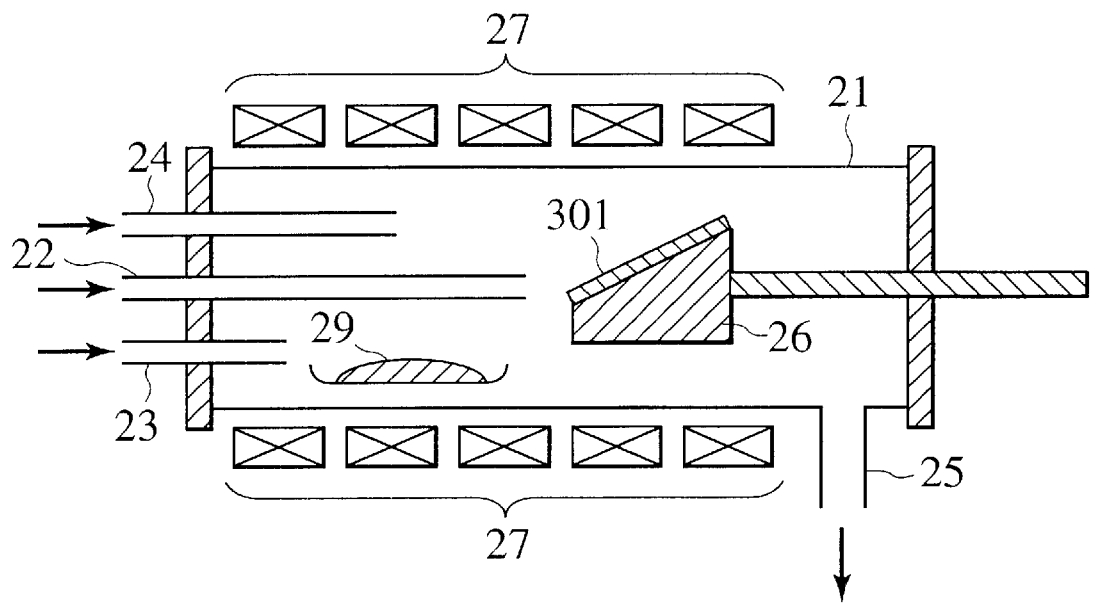
FIG. 2A is a schematic cross sectional view showing an example of the structure of chloride-MOCVD equipment used for preparing an epitaxial-substrate of the present invention.

FIG. 2A shows an outline of the example of a chloride-MOCVD equipment used in a method for preparing an epitaxial-substrate of the present invention. This chloride-MOCVD equipment is the VPE equipment capable of carrying out successively both a chloride transport VPE and a MOCVD.

As shown in FIG. 2A, gas introduction tubes 22, 23 and 24 for introduction of $NH_3$ gas, HCl gas and MO gas, respectively are introduced into a reaction chamber 21 made of quartz in the chloride-MOCVD equipment of the present invention, penetrating through a flange at one end of the reaction chamber 21. A susceptor 26 made of graphite is introduced into the reaction quarts chamber 21 and a sapphire substrate 301 serving as the bulk-substrate of the present invention is mounted thereon. In addition, an exhaust tube 25 is connected to the quartz reaction chamber 21, configured such that it can exhaust the reacted gases from the quartz reaction chamber 21. A vacuum system, not shown in the figure, encompassing valves, tubes and vacuum pumps such as a turbo-molecular pump, a mechanical booster pump and a rotary pump and connected into the exhaust tube 25 is connected to the exhaust tube 25. A resistive heater 27 is disposed around the quartz reaction chamber 21 and thereby the graphite susceptor 26 is heated. Hence, the resistive heater 27 heats the sapphire substrate 301 located directly on the susceptor 26. Then, $NH_3$ gas and HCl gas are supplied through gas introduction tubes 22 and 23, respectively while being flow-controlled by mass flow controllers (MFCs) not shown in the figure. From the gas introduction tube 24, MO gasses such as TMG, trimethylindium (TMI) and trimethylaluminium (TMA), nitrogen ($N_2$) and hydrogen ($H_2$) gases are supplied while being flow-controlled by MFCs. It is also possible to supply a doping gas such as monosilane gas ($SiH_4$) and biscyclopentadienyl magnesium ($Cp_2Mg$) from the gas introduction tube 24. These gasses are exhausted through the exhaust tube 25. Though the gas introduction tube 24 shown in FIG. 2A is only one, a plurality of gas introduction tubes 24 may be installed corresponding to the number of kinds of gases.

In order to carry out the MOCVD method in the chloride-MOCVD equipment illustrated in FIG. 2A, $NH_3$ gas is supplied from the gas introduction tubes 22 and at the same time, MO gas is introduced from the gas introduction tube 24 along with hydrogen and/or nitrogen gas, as the carrier gas, which is also introduced into the quartz reaction chamber 21. The $NH_3$ gas, MO gas and the carrier gas are introduced into the quartz reaction chamber 21 at required flow rates, respectively. On the other hand, when the chloride transport VPE is carried out, $NH_3$ and HCl gasses are introduced from the $NH_3$ gas introduction tube 22 and the HCl gas introduction tube 23, respectively. The introduced HCl gas reacts with liquid gallium 29 to generate GaCl gas by the reaction

$$2Ga+2HCl=2GaCl+H_2. \qquad (1)$$

The GaCl gas along with the $NH_3$ gas are fed into the surface of the sapphire substrate 301 located on the susceptor 26 to grow a single crystalline GaN layer epitaxially. Thus, in the chloride-MOCVD equipment of the present invention, both the chloride transport VPE and the MOCVD can be carried out isuccessively by switching the corresponding gases in the quartz reaction chamber 21.

MOCVD Equipment

Figure 2B:
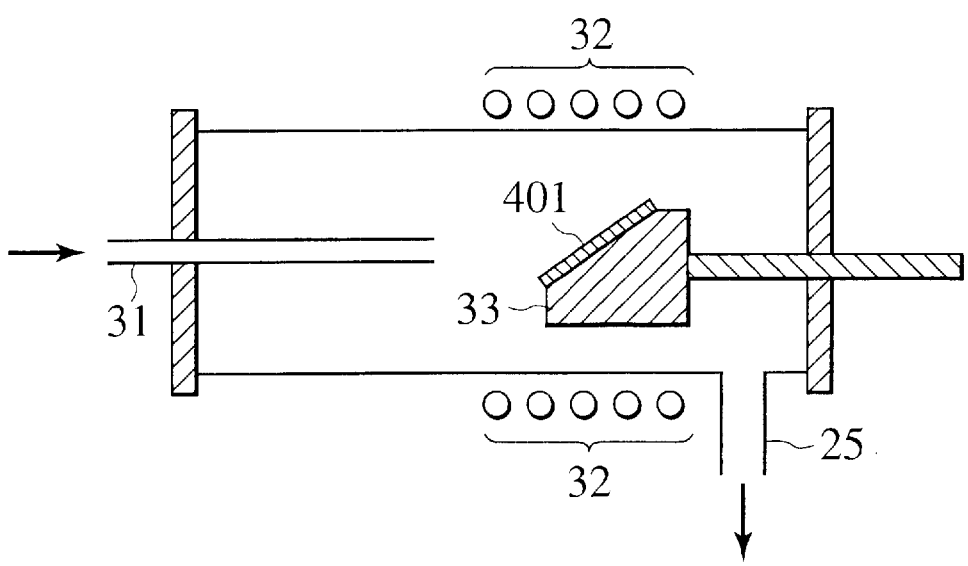
FIG. 2B is a schematic cross sectional view showing an example of the structure of MOCVD equipment used for manufacturing a semiconductor device of the present invention.

FIG. 2B shows an outline of the example of the MOCVD equipment used in the method of manufacturing a semiconductor device of the present invention. A gas introduction tube 31 is introduced through a flange at one end of the reaction quartz chamber. A susceptor 33 made of graphite is introduced into the reaction quartz chamber through another flange at the opposite end of the reaction chamber. An epitaxial-substrate 401, 411 or 421 of the present invention as described below is mounted on the graphite susceptor 33. The gas exhaust tube 25 is connected to the reaction quartz chamber, configured such that it can exhaust the reacted gases from the reaction quartz chamber. A radio-frequency (RF) heating coil 32 is disposed around the reaction quartz chamber. The graphite susceptor 33 is heated by applying RF waves in the range from 500 kHz to 5 MHz through the RF heating coil 32, so that the epitaxial-substrate 401 located directly on the susceptor 33 is also induction-heated to a required temperature. MO gas such as TMG, TMI and TMA and $NH_3$ gas, HCl and the doping gas such as $SiH_4$, and $Cp_2Mg$ are supplied by controlling the each flow rate by the corresponding MFCs not shown in the figure. These gasses are exhausted through the exhaust tube 25. Though only the gas introduction tube 21 is shown in FIG. 2B, a plurality of gas introduction tubes 21 corresponding to kinds of gases may be disposed.

Methods for Preparing Epitaxial-Substrate

The present inventors found that when a single crystalline GaN based semiconductor layer is newly grown epitaxially on a single crystalline GaN based semiconductor layer having once epitaxially grown flat, there are two growing morphologies corresponding to the conditions as follows:

(a) A thick single crystalline GaN based semiconductor layer is grown epitaxially on the sapphire substrate 301 by the chloride transport VPE using the equipment thereof. Then the substrate temperature is once decreased to room temperature and the sapphire substrate 301 is unloaded from the reaction chamber of the chloride transport VPE equipment into atmosphere. Thereafter, the sapphire substrate 301 is introduced again into the reaction chamber of another growing equipment such as MOCVD equipment shown in FIG. 2B. In this case, three-dimensional island-like growth occurs first in the initial growing process followed by their coalescence and then a flat epitaxial growth starts.

(b) On the other hand, the single crystalline GaN based semiconductor layer is grown epitaxially on the sapphire substrate 301 by the MOCVD method. Using the chloride-MOCVD equipment shown in FIG. 2A, successively a single crystalline GaN based semiconductor layer is grown in the same quartz reaction chamber 21 by the chloride transport VPE method. In this case, the island-like growth does not occur and flat epitaxial growth occurs from the start.

As a result of the detailed investigation, it was found that the growth starts from the three dimensional island-like growth in the early stage even in the case of re-growth in the same chloride-MOCVD equipment, if the sapphire substrate 301 is once removed from the reaction quartz chamber to expose atmosphere ambient by decreasing the temperature and then returned again to the reaction quartz chamber to be re-grown. Such a tendency of the three dimensional island-like growth is observed more noticeably when the growth rate of the single crystalline GaN based semiconductor layer is 10 μm/h or more.

It is not distinctively understood whether the factor inhibiting the flat epitaxial growth is ascribable to the raising and lowering of the temperature or to the oxidization of the surface exposed to the atmosphere ambient. However, it has been clarified by another experiment that whether the three dimensional island-like growth is occurred or not at the initial stage of growth strongly affects the crystallographic perfection of the single crystalline GaN based semiconductor layer grown epitaxially thereon. That is, a detailed observation of the surface of the single crystalline GaN based semiconductor layer by optical or electron microscopes exhibits hexagonal micro-holes in many cases when the growth starts from the three dimensional island-growth. In the case of growth started from the three dimensional island-like growth, density of these micro-holes is noticeably high and their size is far large. Hence a clear difference in the surface morphology is appeared between the growth wherein a generation of three-dimensional island-like growth is observed at the early stage and the growth without generation thereof.

Especially, the present inventors have found that the size of micro-holes generated at the surface of growth layer becomes smaller when the GaN based semiconductor layer is grown epitaxially on the substrate made of GaN based semiconductor layer containing aluminum (Al), which may be referred as the AlGaN based semiconductor layer. And it was ascertained, by various experiments, that an excellent surface morphology is constantly obtained with high reproducibility by the epitaxial growth on the substrate made of the AlGaN based semiconductor layer.

Furthermore, regarding each single crystalline GaN based semiconductor layer grown on the bulk-substrate as "a pseudo-surface" of the epitaxial-substrate, a required laminated structure necessary for the LD such as a clad layer and an active layer is re-grown on the pseudo-surface thereof by the MOCVD method. When the threshold current densities of the LDs thus obtained are compared, we can understand that the difference of the threshold current densities depends on the difference between the surface morphologies. And the difference between the surface morphologies results in a very large difference in crystallographic qualities of the growing layers. In the test species with high threshold current density, relatively large crystalline defects called as the nanopipes are generated in an active layer region of InGaN multi-quantum well (MQW) structure e as shown in FIG. 1. The dislocation D between p-GaN layer 901 and p-GaN layer 903 may be generated by the micro-holes, dragging the defects in underlying p-GaN layer 903. On the MQW, the p-GaN layer 901 is grown. A region, which might indicate "the facet-growth" due to the crystalline defects D, can be seen on upper right of the MQW layer 902. When a substrate with poor surface morphology is used, the threshold current density will increase, depending on the increase of the current component not contributing to the semiconductor lasing, owing to the crystalline defects such as the dislocations D in the single crystalline GaN based semiconductor layer.

Consequently, the defect density of the single crystalline GaN based semiconductor layer can be reduced, when preparing an epitaxial-substrate having an excellent surface morphology and a high crystal perfection and carrying out the epitaxial growth thereon. When a semiconductor device such as an LD is fabricated by an epitaxial growth on the surface of an epitaxial-substrate having a high crystallographic perfection, an excellent performance and stability of the device will be attained. For the case of the LD, a reduction of the threshold current density will be possible.

Three methods of preparing GaN epitaxial-substrate, AlGaN/GaN epitaxial-substrate and AlGaN epitaxial-substrate having high crystallographic perfections will be described below. At first, an example of the method for preparing a GaN epitaxial-substrate will be described below referring to FIGS. 3A to 3E.

(a) Pretreatment Process (Thermal Cleaning):

First, the c plane sapphire substrate 301 having a diameter of 50.8 mm is prepared as the bulk-substrate of the present invention. This c plane sapphire substrate 301 is washed and chemically cleaned. The cleaned sapphire substrate 301 is located on the susceptor 26 of the chloride-MOCVD equipment shown in FIG. 2A. Next, after the reaction quartz chamber is evacuated by a vacuum pump (not shown in the figure) through the evacuation tube 25, nitrogen ($N_2$) gas is introduced into the reaction quartz chamber, and inside thereof is replaced by the $N_2$ gas. Thereafter, the susceptor 26 is heated up to the substrate temperature of 1000° C. by the resistive heater 27 while $N_2$ gas being supplied to the reaction chamber 21 through the gas introduction tube 24. At this time, a supply of HCl gas of about 0.1 liter per minute into liquid gallium (Ga) through the HCl introduction tube 23 is preferred, because this gas introduction condition will lead to a final GaN epitaxial growing layer with good surface morphology. The "thermal cleaning" is carried out with maintaining the condition for 10 minutes.

(b) Pretreatment Process (Nitridation of the Surface):

After stopping the HCl gas, the temperature of the resistive heater 27 is decreased until the susceptor temperature becomes stable at 500° C. Subsequently, along with the supply of a mixed gas of hydrogen ($H_2$) and nitrogen ($N_2$) gases through the gas introduction tube 25, $NH_3$ gas is supplied through the gas introduction tube 22. The flow rates of hydrogen and nitrogen gasses through the gas introduction tube 24 are 1 l/min. and 0.5 l/min, respectively and the flow rate of $NH_3$ gas through the $NH_3$ gas introduction tube 22 is 0.95 l/min. "Nitridation" of the c plane sapphire substrate 301 is carried out with maintaining the condition until the temperature becomes stable.

Figure 3A:
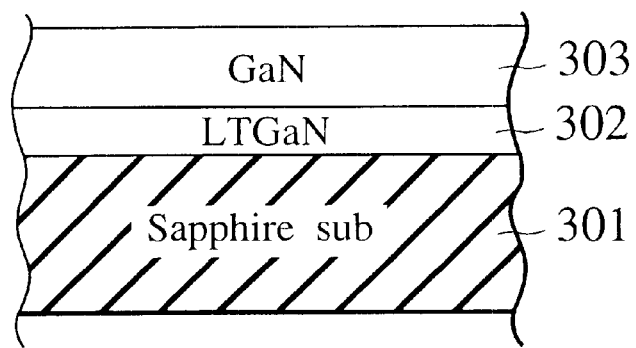
FIGS. 3A, 3B, 3C, 3D, and 3E are cross sectional views showing an example of the process sequence of preparing a GaN epitaxial-substrate of the present invention.

(c) First Process:

Thereafter, in order to grow the GaN layer 302 at reduced temperature, TMG gas is supplied at $3.7 \times 10^{-5}$ mol/min. for four minutes in addition to the hydrogen gas and the nitrogen serving as carrier gasses from the gas introduction tube 24, with the flow rate of $NH_3$ gas from the gas introduction tube 22 held at the above-mentioned value. At this time, HCl gas is used with a flow rate of 0.1 l/min. simultaneously with TMG. Thus a GaN layer 302 is grown at reduced temperature to a thickness of 50 nm on the surface of the c plane sapphire substrate 301 as shown in FIG. 3A. Hereinafter the GaN layer 302 grown at reduced temperature is referred as "the LT-GaN layer 302". After stopping the supply of TMG and HCl gases, the temperature is again increased until the temperature of the susceptor 26 rises to 1000° C. Thereafter, the growth by the MOCVD method is carried out for 1 hour, while TMG gas is supplying at a flow rate of $1.4 \times 10^{-4}$ mol/min. from the gas introduction tube 24 along with $NH_3$ gas at a flow rate of 0.95 l/min. Thus, a GaN epitaxial layer (a first GaN based semiconductor layer) 303 having a thickness of 2 μm is deposited on the LT-GaN layer 302 grown at reduced temperature as shown in FIG. 3A.

Figure 3B:
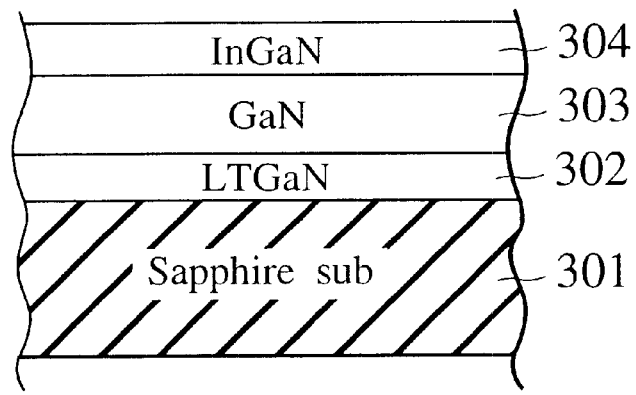

(d) Second Process:

Next, temperature is decreased to 700° C. and TMG gas is again supplied at a flow rate of 1.4×10⁻⁵ mol/min. from the gas introduction tube 24, along with TMI gas at a flow rate of 2.7×10⁻³ mol/min. At the same time, HCl gas is supplied at a flow rate of 0.1 l/min. and NH₃ gas is supplied at a flow rate of 0.95 l/min. from the NH₃ gas introduction tube 22 and is maintained for 60 min., resulting in growth of an InGaN epitaxial layer (an InGaN based semiconductor layer) 304 having a thickness of 0.2 μm by the MOCVD method as shown in FIG. 3B.

Figure 3C:
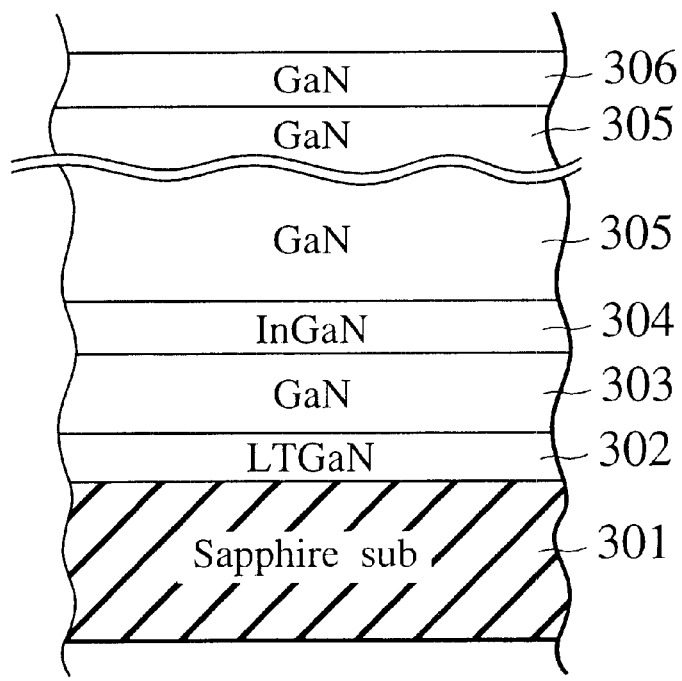

(e) Third Process:

Thereafter, the supplies of TMI, TMG and HCl gases are stopped and then the temperature of the susceptor is increased to 1000° C., while NH₃ gas is maintained to be supplied. After the temperature of the susceptor becomes stable, HCl gas is introduced from the HCl gas introduction tube 23 to generate GaCl gas by a reaction with the liquid gallium 29, resulting in a chloride transport VPE of a GaN layer 305 at a growth rate of about 50 μm/h. As a result, the GaN epitaxial layer (a second GaN based semiconductor layer) 305 having a thickness of 80 μm is obtained on the InGaN epitaxial layer 304 by the chloride transport VPE as shown in FIG. 3C. Thereafter, the HCl gas supplied to the liquid gallium is stopped and in place thereof TMG and HCl gases are supplied from the gas introduction tube 24, resulting in an epitaxial growth of a GaN layer (a third GaN based semiconductor layer) 306 at a rate of 1.6 μm/h by the MOCVD method. As a result, the GaN epitaxial layer 306 having a thickness of 0.5 μm is successively grown on the GaN epitaxial layer 305 as shown in FIG. 3C.

Figure 3D:
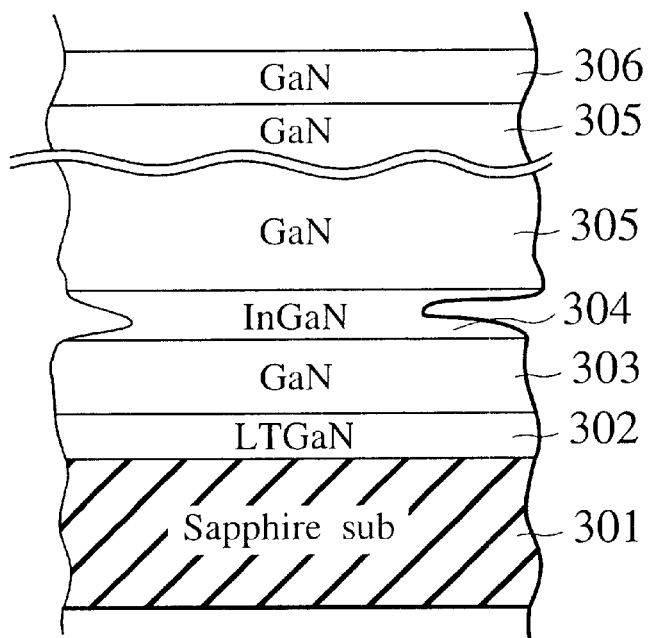
Figure 3E:
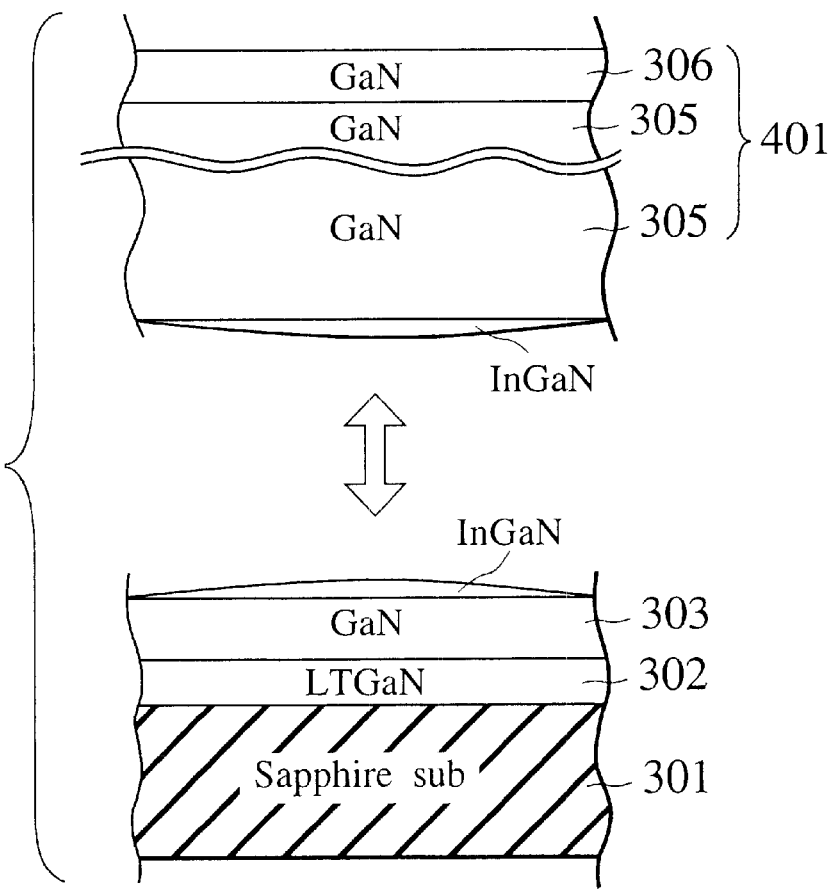

(f) Fourth Process:

Then the temperature of the susceptor is decreased to 500° C. and at this temperature, gas etching (vapor phase etching) is carried out by introducing hydrogen gas from the gas introduction tube 24 into the quartz reaction chamber 21. Because only the InGaN epitaxial layer 304 is selectively etched by the gas etching, a side etching thereof only progresses as shown in FIG. 3D. The gas etching of the InGaN epitaxial layer 304 is not necessarily to be done until complete removal of the InGaN epitaxial layer 304 but can be stopped at the stage of side etching progressed to some extent so as to form slits (or slit-shaped grooves) between the GaN epitaxial layers 303 and the GaN epitaxial layers 305 as shown in FIG. 3D. When the laminated structure wherein the side etching progressed is cooled down to room temperature, it is divided by the stress due to the thermal strain into an upper laminated structure constituted of the GaN epitaxial layers 305 and 306 and a lower laminated structure constituted of the GaN epitaxial layer 303, the LT-GaN layer 302 and the sapphire substrate 301 as shown in FIG. 3E. By the process of such a peeling off, the upper laminated structure constituted of the GaN epitaxial layers 305 and 306 can be used as the GaN epitaxial-substrate 401.

According to the method of fabricating the GaN epitaxial-substrate 401 of the present invention described above, after growing the GaN single crystalline film 303 at relatively low growth rate (typically about 2 μm/h) by the MOCVD method, the InGaN single crystalline film 304 is grown epitaxially and then the GaN single crystalline film 305 is grown epitaxially thereon at high speed. Therefore, filling up the micro-holes, once formed, such that the surface is planarized, grows the GaN single crystalline film 305. Eventually, according to the method of the present invention for preparing the GaN epitaxial-substrate, the GaN epitaxial-substrate 401 having a high crystallographic perfection and an excellent surface morphology can be fabricated simply.

Furthermore, the upper laminated structure constituted of the GaN epitaxial layers 305 and 306 is simply peeled off by the stress ascribable to the thermal strain from the lower laminated structure constituted of the GaN epitaxial layers 303, the LT-GaN layer 302 and the sapphire substrate 301. Therefore, it is not necessary to polish the hard sapphire substrate 301 in order to obtain the GaN epitaxial-substrate 401. As the sapphire substrate 301 has a Mohs hardness of 9, the polishing needs very long time. That is, the GaN epitaxial-substrate 401 can be obtained in far shorter time than the time needed for obtaining the sapphire substrate 301 by polishing, and a high productivity of the GaN epitaxial-substrate 401 can be obtained.

Next, a method for preparing an AlGaN/GaN epitaxial-substrate will be described referring to FIGS. 4A to 4D. In the process sequence of preparing an AlGaN/GaN epitaxial-substrate, the pretreatment process, the first and the second processes follow exactly same processes as that for preparing the GaN epitaxial-substrate 401 explained above. Then, we will start from the third process, to avoid duplication.

Figure 4A:
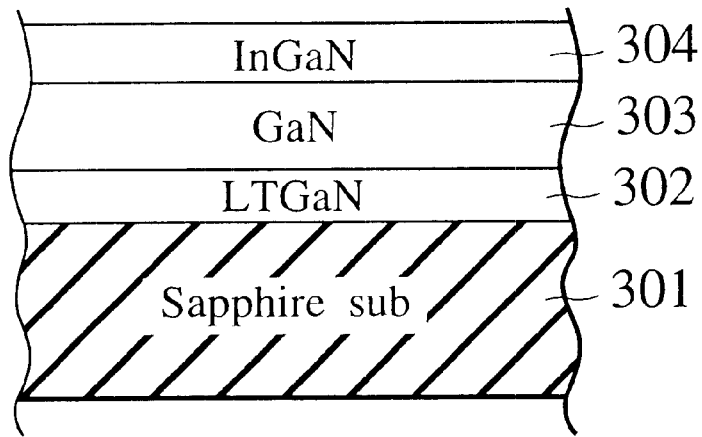
FIGS. 4A, 4B, 4C, and 4D are cross sectional views showing an example of the process sequence of preparing a AlGaN/GaN epitaxial-substrate of the present invention.
Figure 4B:
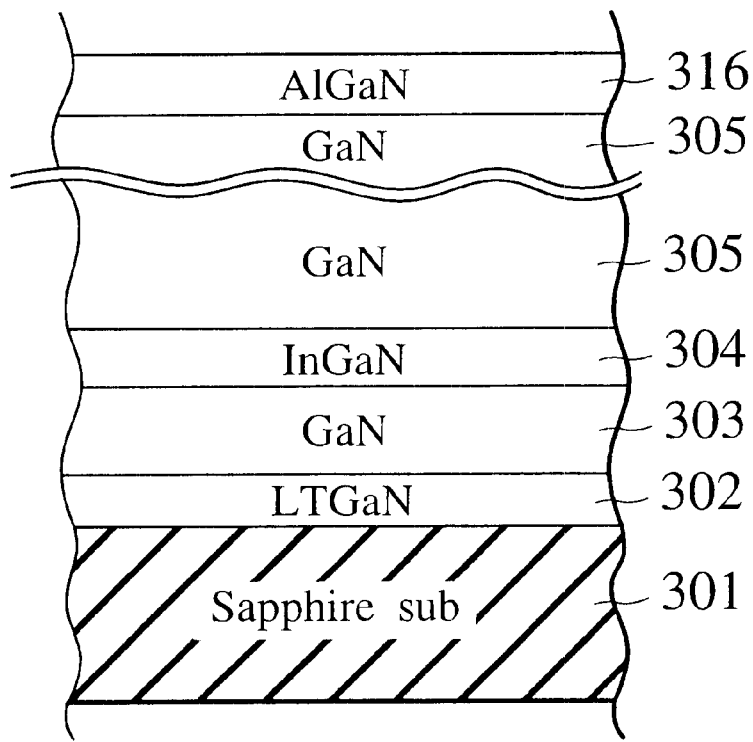

(a) Third Process for Obtaining AlGaN/GaN Epitakial Substrate:

As shown in FIG. 4A, by the second process, the InGaN epitaxial layer 304 is similarly grown on the GaN epitaxial layer 303 by the MOCVD method. Thereafter, the supplies of TMI, TMG and HCl gases are stopped and then the temperature of the susceptor is increased to 1000° C., while NH₃ gas is maintained to be supplied. After the temperature of the susceptor becomes stable, HCl gas is introduced from the HCl gas introduction tube 23 to generate GaCl gas by the reaction with the liquid gallium 29, resulting in the chloride transport VPE of a GaN layer (a second GaN based semiconductor layer) 305 at a growth rate of about 50 μm/h. As a result, the GaN epitaxial layer 305 having a thickness of 80 μm is obtained on the InGaN epitaxial layer 304 by the chloride transport VPE as shown in FIG. 4B. Thereafter, the flow rate of the HCl gas supplied to the liquid gallium is decreased, and TMA, TMG, NH₃ and small amount of HCl gases are supplied from the gas introduction tube 24, resulting in an epitaxial growth of a AlGaN epitaxial layer (a third GaN based semiconductor layer) 316 at a growth rate of approximately 40 μm/h. Here, the mole fraction x of the $Al_xGa_{1-x}N$ epitaxial layer 316 should preferably lies in the range defined by:

$$0.3 > x \geq 0.05 \quad (2)$$

By selecting the mole fraction x of the $Al_xGa_{1-x}N$ epitaxial layer 316 within this range, a higher etching selectivity of the InGaN epitaxial layer 304 against the $Al_xGa_{i-x}N$ epitaxial layer 316 can be obtained. Further, the strain due to lattice mismatch ascribable to the hetero-structure can be minimized with the mole fraction x defined by Eq. (2). As a result, the AlGaN epitaxial layer 316 having a thickness of 10 μm is successively grown on the GaN epitaxial layer 305 as shown in FIG. 4B.

Figure 4C:
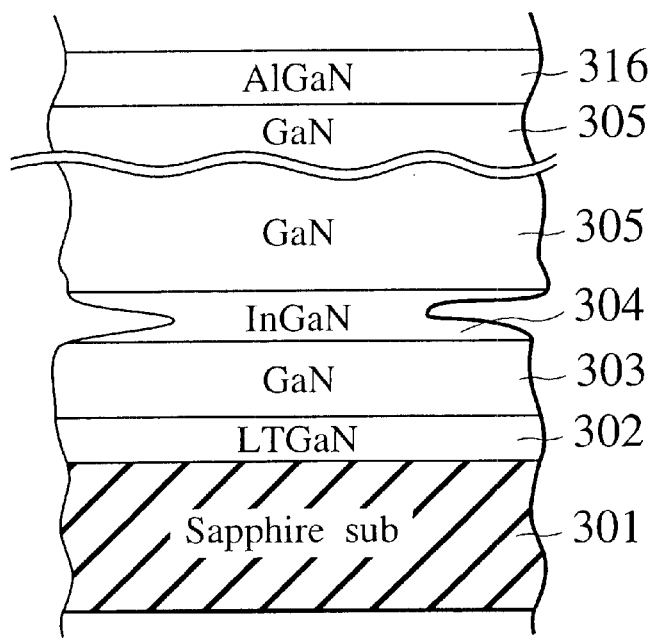
Figure 4D:
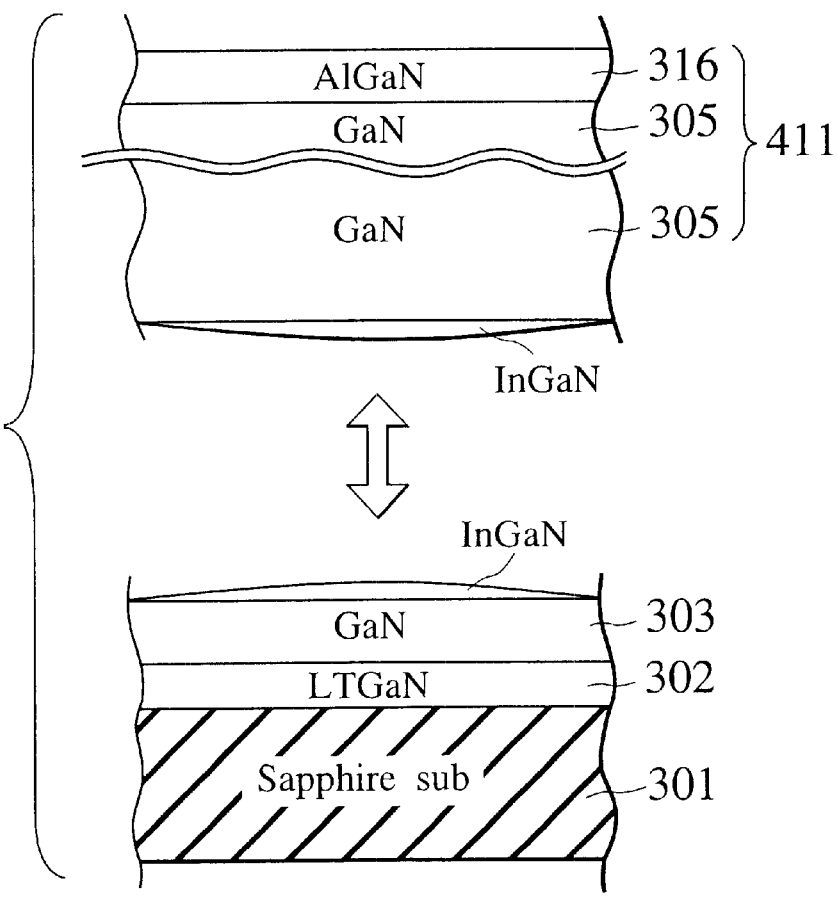

(b) Fourth Process for Obtaining AlGaN/GaN Epitakail Substrate:

Then the temperature of the susceptor is decreased to 700° C. and at this temperature, gas etching is carried out by introducing hydrogen gas from the gas introduction tube 24 into the quartz reaction chamber 21. Because only the InGaN epitaxial layer 304 is selectively etched by the gas etching, a side etching thereof only progresses as shown in FIG. 4C. The gas etching of the InGaN epitaxial layer 304 is not necessarily to be done until complete removal of the InGaN epitaxial layer 304 but can be stopped at the stage of side etching progressed to some extent so as to form slit as shown in FIG. 4C. When the laminated structure wherein the side etching progressed is cooled down to room temperature, it is divided by the stress due to the thermal strain into an upper laminated structure constituted of the GaN epitaxial layer 305 and AlGaN epitaxial layer 316 and a lower laminated structure constituted of the layers below the GaN epitaxial layer 303 down to the sapphire substrate 301 as shown in FIG. 4D. By the process of such a peeling off, the upper laminated structure constituted of the GaN epitaxial layer 305 and AlGaN epitaxial layer 316 can be used as the AlGaN/GaN epitaxial-substrate 411.

According to the method of fabricating the AlGaN/GaN epitaxial-substrate 411 of the present invention described above, e:-after growing the GaN single crystalline film 303 at relatively low growth rate (typically about 2 $\mu$m/h) by the MOCVD method, the InGaN single crystalline film 304 is grown epitaxially and then the GaN single crystalline film 305 is grown epitaxially thereon at high speed. Therefore, the GaN single crystalline film 305 is grown by filling up the micro-holes once formed such that the surface is planarized. Eventually, according to the method of the present invention for preparing the epitaxial-substrate, the AlGaN/GaN epitaxial-substrate 411 having a high crystallographic perfection and an excellent surface morphology can be fabricated simply.

Since, the top layer is the AlGaN epitaxial layer 316, "the etching selectivity" defined as the etching rate ratio of the InGaN epitaxial layer 304 to the AlGaN epitaxial layer 316 becomes approximately 2400 during the gas etching in the fourth process, if the mole fraction x of the $Al_xGa_1-xN$ epitaxial layer 316 is 0.1. Turning now to the structure shown in FIG. 3D, as the top layer is the GaN epitaxial layer 306, "the etching selectivity" defined as the etching rate ratio of the InGaN epitaxial layer 304 to the GaN epitaxial layer 306 is 40, it is evident that a large technical advantage is achieved by using the top AlGaN epitaxial layer 316. Namely, excessive etching time for the gas etching against the InGaN epitaxial layer 304 is allowed so as to make deeper side slits in the structure shown in FIG. 4C. Therefore, the technical advantage such that the exfoliation process with the aid of thermal strain in the fourth process becomes easy can be achieved. In this way, the upper laminated structure constituted of the GaN epitaxial layer 305 and AlGaN epitaxial layer 316 is simply peeled off by the stress ascribable to the thermal strain from the lower laminated structure constituted of the GaN epitaxial layer 303, the LT-GaN layer 302 and the sapphire substrate 301. Therefore, it is not necessary to polish the hard sapphire substrate 301 in order to obtain the AlGaN/GaN epitaxial-substrate 411, and the AlGaN/GaN epitaxial-substrate 411 can be obtained in far shorter time than the time needed for obtaining the sapphire substrate 301 by polishing.

Although the AlGaN/GaN epitaxial-substrate 411 stated above,embraces the GaN epitaxial layer (the second GaN based semiconductor layer) 305 and the top AlGaN epitaxial layer (the third GaN based semiconductor layer) 316, an AlGaN epitaxial layer can replace the lower GaN epitaxial layer 305 in the stacked structure. Namely, all of the upper laminated layers can be constituted of AlGaN epitaxial layers so as to provide a single piece AlGaN epitaxial-substrate. The method for preparing the AlGaN epitaxial-substrate will be described referring to FIGS. 5A and 5B. In the process sequence of preparing the AlGaN epitaxial-substrate, the pretreatment process, the first and the second processes follow exactly same processes as that for preparing the GaN epitaxial-substrate 401 explained above. Then, we will start from the third process, to avoid duplication.

Figure 5A:
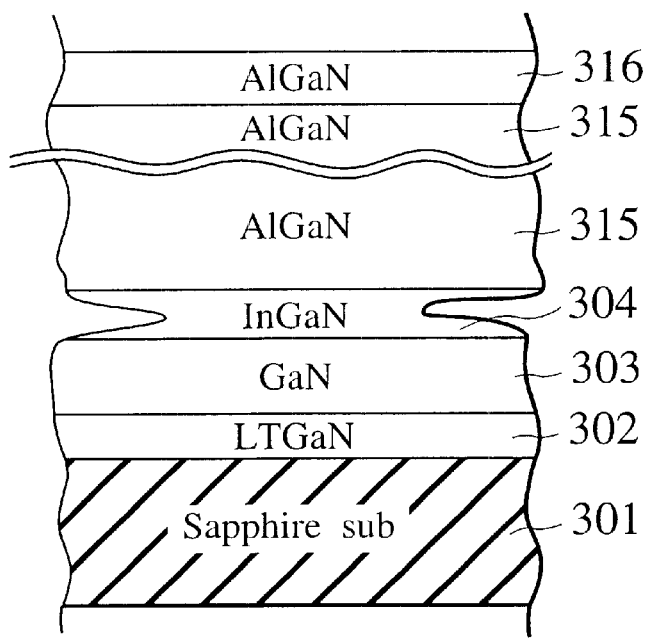
FIGS. 5A and 5B are cross sectional views showing an example of the process sequence of preparing an AlGaN epitaxial-substrate of the present invention.

(a) Third Process for Obtaining AlGaN Epitakial Substrate:

After the second process in which the InGaN epitaxial layer (the InGaN based semiconductor layer) 304 is grown on the GaN epitaxial layer (the first GaN based semiconductor layer) 303 by the MOCVD method, the supplies of TMI, TMG and HCl gases are stopped and then the temperature of the susceptor is increased to 1000° C., while $NH_3$ gas is maintained to be supplied. After the temperature of the susceptor becomes stable, TMA gas is supplied from the gas introduction tube 24. Further, HCl gas is introduced from the HCl gas introduction tube 23 to generate GaCl gas by the reaction with the liquid gallium 29, resulting in the chloride transport VPE of a AlGaN layer (a second GaN based semiconductor layer) 315 at a growth rate of about 20 $\mu$m/h. As a result, the AlGaN epitaxial layer 315 having a thickness of 80 $\mu$m is obtained on the InGaN epitaxial layer 304 by the chloride transport VPE as shown in FIG. 5A. Thereafter, the flow rate of the HCl gas supplied to the liquid gallium is decreased, and TMA, TMG, $NH_3$ and small amount of HCl gases are supplied from the gas introduction tube 24, resulting in an epitaxial growth of a AlGaN epitaxial layer (a third GaN based semiconductor layer) 316 at a growth rate of approximately 10 $\mu$m/h. As a result, the AlGaN epitaxial layer 316 having a thickness of 10 $\mu$m is successively grown on the AlGaN epitaxial layer 315 as shown in FIG. 5A. Here, the mole fraction x of the $Al_xGa_1-xN$ epitaxial layer 316 should be defined by Eq. (2).

Figure 5B:
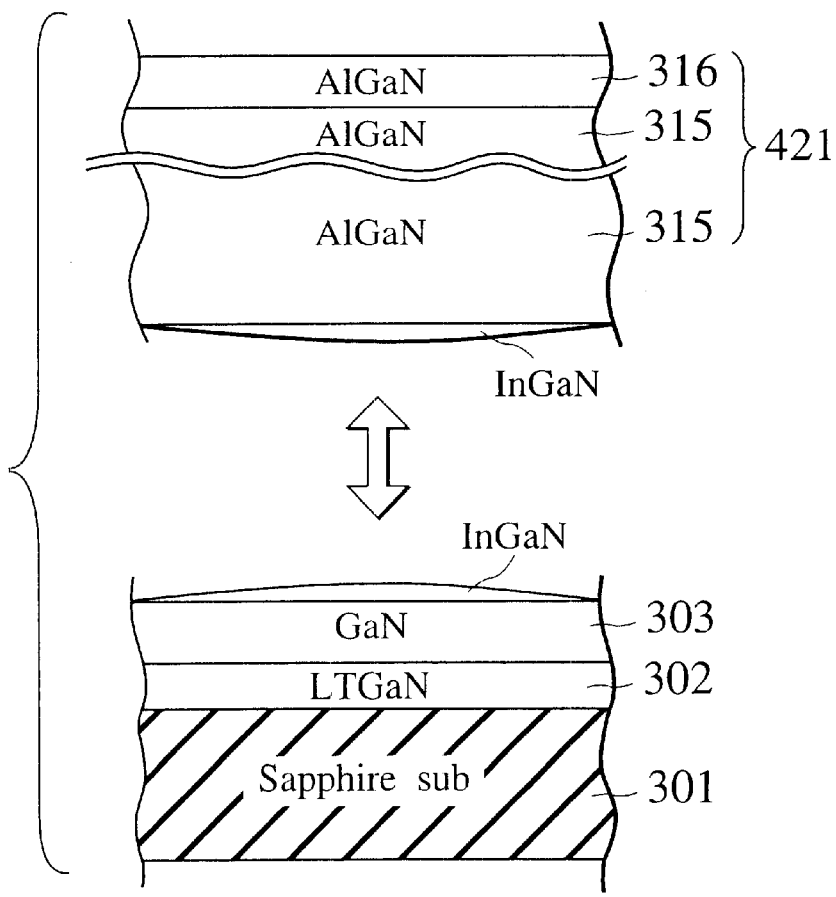

(b) Fourth Process for Obtaining AlGaN Epitakial Substrate:

Then the temperature of the susceptor is decreased to 700° C. and at this temperature, gas etching is carried out by introducing hydrogen gas from the gas introduction tube 24 into the quartz reaction chamber 21 . Because only the InGaN epitaxial layer 304 is selectively etched by the gas etching, a side etching thereof only progresses as shown in FIG. 5A. The gas etching of the InGaN epitaxial layer 304 is not necessarily to be done until complete removal of the InGaN epitaxial layer 304 but can be stopped at the stage of side etching progressed to some extent as shown in FIG. 5A. When the laminated structure wherein the side etching progressed is cooled down to room temperature, it is divided by the stress due to the thermal strain into an upper laminated structure constituted of the AlGaN epitaxial layer 315 and AlGaN epitaxial layer 316 and a lower laminated structure constituted of the layers below the GaN epitaxial layer 303 down to the sapphire substrate 301 as shown in FIG. 5B. By the process of such a peeling off, the upper laminated structure constituted of the AlGaN epitaxial layer 315 and AlGaN epitaxial layer 316 can be used as the AlGaN epitaxial-substrate 421.

According to the method of fabricating the AlGaN epitaxial-substrate 421 of the present invention described above, after growing the GaN single crystalline film 303 at relatively low growth rate (typically about 2 $\mu$m/h) by the MOCVD method, the InGaN single crystalline film 304 is grown epitaxially and then the AlGaN epitaxial layer 315 is grown epitaxially thereon at high speed. Therefore, the AlGaN epitaxial layer 315 is grown by filling up the micro-holes once formed such that the surface is planarized. Eventually, according to the method of the present invention for preparing the epitaxial-substrate, the AlGaN epitaxial-substrate 421 having a high crystallographic perfection and an excellent surface morphology can be fabricated simply.

Furthermore, the upper laminated structure constituted of the AlGaN epitaxial layer 315 and AlGaN epitaxial layer 316 is simply peeled off by the stress ascribable to the thermal strain from the lower laminated structure constituted of the GaN epitaxial layer 303, the LT-GaN layer 302 and the sapphire substrate 301. Therefore, it is not necessary to polish the hard sapphire substrate 301 in order to obtain the AlGaN epitaxial-substrate 421, and the AlGaN epitaxial-substrate 421 can be obtained in far shorter time than the time needed for obtaining the sapphire substrate 301 by polishing. Especially, as the AlGaN epitaxial layers 315 and 316 are encompassed, "the etching selectivity" defined as the etching rate ratio of the InGaN epitaxial layer 304 to the AlGaN epitaxial layers 315 and 316 becomes approximately 2400 during the gas etching in the fourth process, if the mole fraction x of the $Al_xGa_{1-x}N$ epitaxial layers 315 and 316 is 0.1. Then, excessive etching time adapted for the gas etching against the InGaN epitaxial layer 304 is allowed so as to make deeper side slit in the structure shown in FIG. 5A. Therefore, the exfoliation process with the aid of thermal strain in the fourth process becomes very easy.

First Embodiment: Method for Manufacturing LD

Next, as an example of the method for manufacturing the semiconductor device according to first embodiment of the present invention using the GaN epitaxial-substrate 401 thus obtained, a method of fabricating a blue-emitting LD will be described.

Figure 6A:
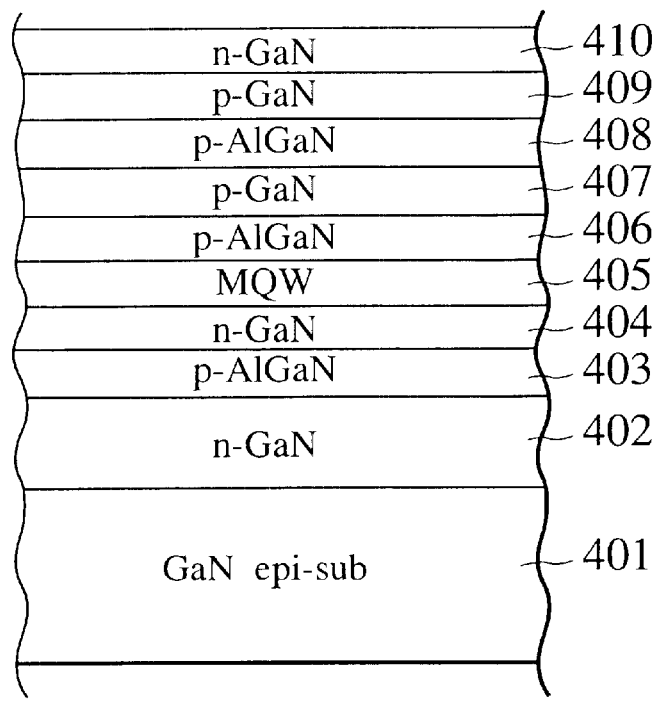
FIGS. 6A, 6B, 6C, and 6D are cross sectional views showing the processes of manufacturing a semiconductor device (semiconductor laser diode) according to first embodiment of the present invention.
Figure 6B:
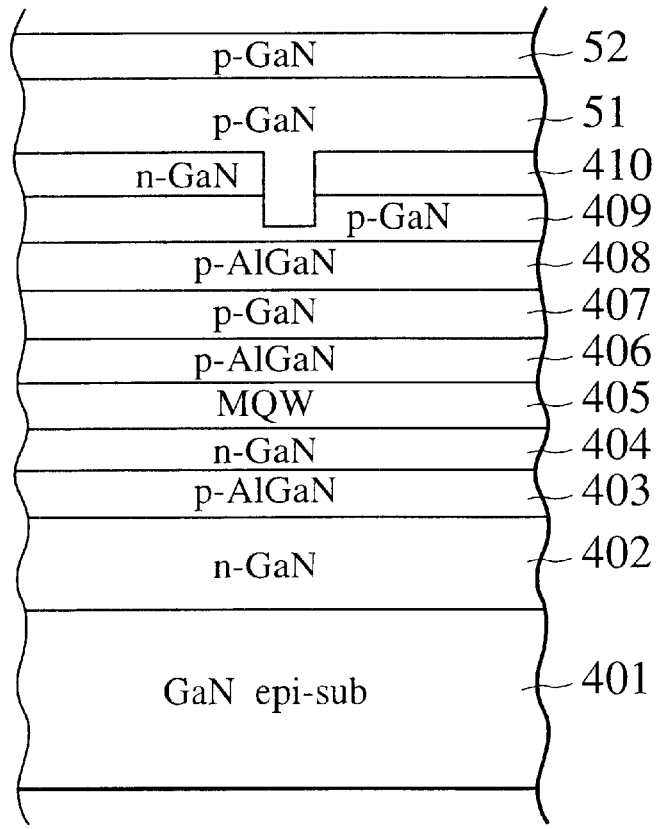
Figure 6C:
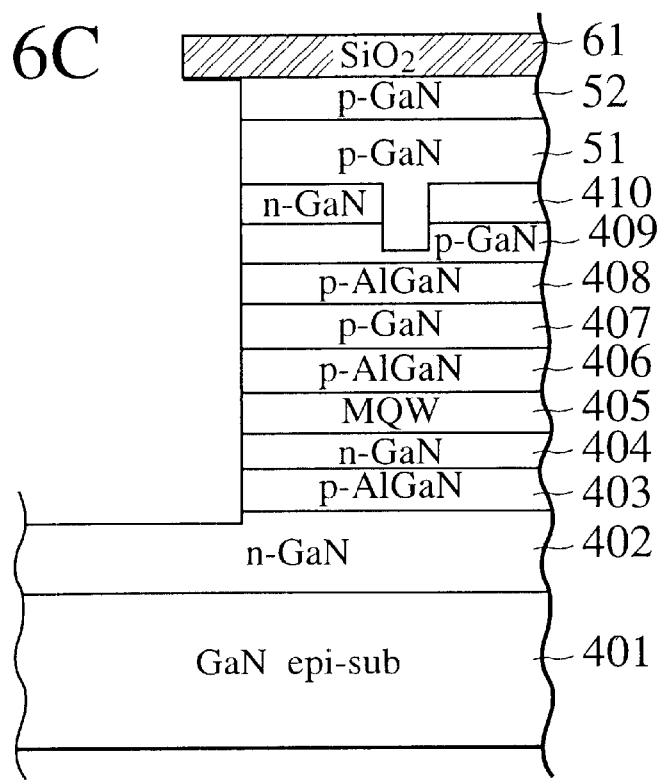
Figure 6D:
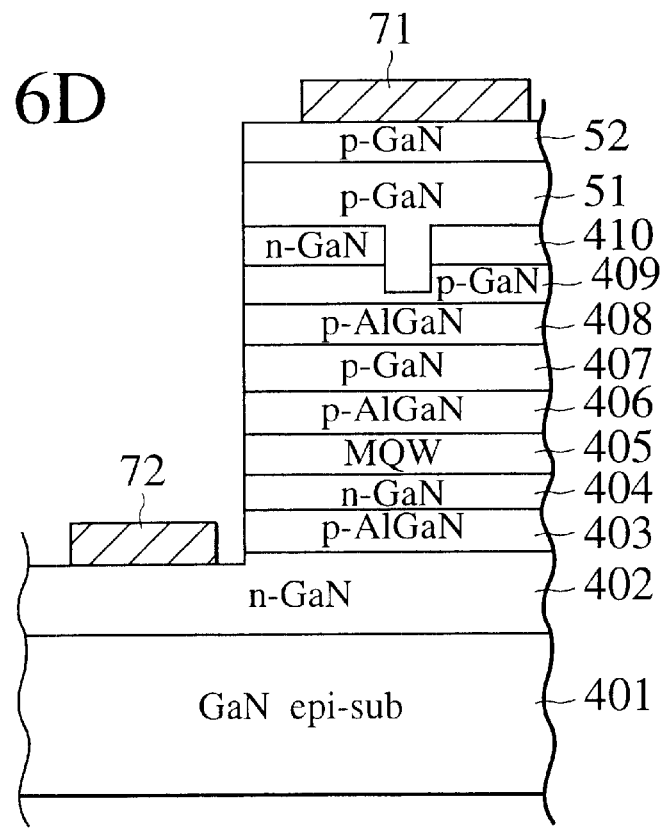

First, a device structure of the blue-emitting LD, which is an object of the method of manufacturing the semiconductor device according to the first embodiment, will be briefly described. The blue-emitting LD is based on a structure wherein an n-GaN epitaxial layer 402, an n-AlGaN epitaxial layer 403, an n-GaN epitaxial layer 404, an MQW active layer 405, a p-AlGaN epitaxial layer 406, a p-GaN epitaxial layer 407, a p-AlGaN epitaxial layer 408, a p-GaN epitaxial layer 409, an n-GaN epitaxial layer 410, a p 4GaN epitaxial layer 51, a p-GaN epitaxi al layer 52 are stacked in this order on the GaN epitaxial-substrate 401 as shown in FIG. 6A. As shown in FIG. 6D, a concave region through the n-GaN epitaxial layer 410, reaching to the n-GaN epitaxial layer 409 is formed and the two n-GaN epitaxial layers 410 divided thereby constitute a current blocking layer. Consequently, the blue-emitting LD is so constructed that the current flows only through the current channel encompassed by the concave region in the p-GaN epitaxial layer 409 to emit effectively a laser beam from the MQW active layer 405. The carriers are confined by a double heterostructure (DH structure) wherein the MQW active layer 405 is sandwiched at the both sides by the clad layers of the n-AlGaN epitaxial layer 403 and the p-AlGaN epitaxial layer 408. The uppermost p-GaN epitaxial layer 52 is an ohmic contact layer with high impurity concentration and thereto an anode electrode 71 is made ohmic contact. A trench for forming the cathode electrode is formed penetrating from the p-GaN epitaxial layer 52 to the n-GaN epitaxial layer 402. A cathode electrode 72 is formed to make ohmic contact to the n-GaN epitaxial layer 402 exposed at the bottom portion of the trench so as to take out the cathode electrode. Hence, the n-GaN epitaxial layer 402 is an ohmic contact layer with high impurity concentration.

The blue-emitting LD according to the first embodiment shown in FIG. 6D can be fabricated by the processes which will be described below. A successive epitaxial layers so as to form a multilayered structure which serves as the body of the blue-emitting LD are grown by use of the MOCVD equipment shown in FIG. 2B.

(a) First, the GaN epitaxial-substrate 401 located on a susceptor 33 is heated by RF power radiated from the RF heater 32, while supplying hydrogen, nitrogen and $NH_3$ gases from a gas introduction tube 31 of the MOCVD equipment shown in FIG. 2B and then the temperature of the susceptor is controlled to be 1150° C. Next, supply of TMG and $SiH_4$ diluted by hydrogen gas is started and a silicon (Si)-doped n-GaN epitaxial layer 402 is grown to a thickness of 4 μm on the GaN epitaxial-substrate 401 as shown in FIG. 6A. Thereafter, a silicon-doped n-AlGaN epitaxial layer 403 is grown on the n-GaN epitaxial layer 402 to a thickness of 0.8 μm by additionally supplying TMA gas. The supply of TMA gas is stopped and subsequently an n-GaN epitaxial layer 404 is grown to a thickness of 0.1 μm on the n-AlGaN epitaxial layer 403.

(b) After the supplies of TMG and $SiH_4$ gases are stopped, temperature of the susceptor is decreased to a stable value of 800° C. Thereafter, two set of TMG and TMI gases are supplied using two set of lines for TMG and TMI, respectively, an MQW active layer 405, or an active layer 405 constituted of four pairs of InGaN quantum well (QW) is deposited as shown in FIG. 6A. The MQW active layer 405 is formed by periodically and alternately stacking an InGaN epitaxial layer having a thickness of 3.5 nm and the In composition of 14% serving as the QW layer and an InGaN epitaxial layer having a thickness of 7 nm and the In composition of 3% serving as the quantum barrier layer.

(c) Supplies of TMI and TMG gases are stopped and then the susceptor temperature is returned to 1160° C. After the susceptor temperature is stabilized at 1150° C., a magnesium (Mg)-doped p-AlGaN epitaxial layer 406 is grown to a thickness of 0.04 μm on the MQW active layer 405 by supplying TMG, TMA and $Cp_2Mg$ gases. Subsequently, TMA gas is stopped and a p-GaN epitaxial layer 407 is grown to a thickness of 0.1 μm on the p-AlGaN epitaxial layer 406. Again, TMA gas is supplied and a p-AlGaN epitaxial layer 408 is grown to a thickness of 0.8 μm on the p-GaN epitaxial layer 407. Subsequently, a magnesium-doped p-GaN epitaxial layer 409 is grown to a thickness of 1 μm on the p-AlGaN epitaxial layer 408 with the supply of TMA gas is kept stopped. Thereafter, at the same time that the supply of $Cp_2Mg$ gas is stopped, $SiH_4$ diluted with hydrogen gas is supplied and an n-GaN epitaxial layer 410 is grown to a thickness of 0.1 μm on the p-GaN epitaxial layer 409.

(d) Thereafter, supplies of TMG and $SiH_4$ gas are stopped and power supply to the RF heating coil 32 is stopped. After the susceptor temperature is decreased to 350° C., supply of $NH_3$ gas is stopped. In the way described above, the multilayered structure of successive epitaxial layers as shown in FIG. 6A can be obtained and a silicon oxide film ($SiO_2$ film), not shown in the figure, is deposited thereon by CVD method. Then, the $SiO_2$ film is delineated to form the etching mask of the n-GaN epitaxial layer 410 by a photolithography and a reactive ion etching (RIE) using an etching gas such as tetrafluoromethan ($CF_4$). Using the mask for etching ($SiO_2$ mask), the successive epitaxial layers are etched by means of RIE wherein the etching gas, for example, boron trichloride ($BCl_3$) gas, or the mixed gas of $Cl_2$ and $BCl_3$ are used. The RIE is carried out until a concave region shown in FIG. 6B is formed in the p-GaN epitaxial layer 409 through the n-GaN epitaxial layer 410

(e) The $SiO_2$ mask, which used in the formation of the concave region, is removed by a $SiO_2$ etchant made of ammonium fluoride ($NH_4F$) solution. The GaN epitaxial-substrate 401, having the successive epitaxial layers thereon, is again loaded into the MOCVD equipment shown in FIG. 2B. In this time also, the RF heating coil 32 emits RF power while $NH_3$ gas is supplying and the surface treatment is carried out after the temperature is stabilized at 1150° C. At the susceptor temperature of 1150° C., a p-GaN epitaxial layer 51 is grown by supplying TMG and Cp₂Mg gases, with the same flow rate of Cp₂Mg gas as that for the p-GaN epitaxial layer 409 already grown and the concave region is plugged with the growth layer having a thickness of 1 μm. On the p-GaN epitaxial layer 51, a p-GaN epitaxial layer 52 is grown by abruptly increasing the flow rate of Cp₂Mg gas by three factors as shown in FIG. 6B. Thereafter, the supply of TMG gas is stopped and power supply to the RF heating coil 32 is stopped. When the susceptor temperature is decreased to 850° C., the supply of NH₃ gas is stopped. After the susceptor temperature is further decreased to nearly room temperature, the GaN epitaxial-substrate 401 whereon the successive epitaxial layers are stacked is unloaded from the MOCVD equipment. The surface of the p-GaN epitaxial layer 52, the outermost surface of the successive epitaxial layers, is observed in detail by naked eye and an optical microscope. By detailed observations with naked eye and the optical microscope, any characteristic patterns such as micro-holes and undulations on the surface of the p-GaN epitaxial layer 52 are not observed. Furthermore, part of a peripheral region of the GaN epitaxial-substrate 401 on which the successive epitaxial layers are stacked is cut and the cross sectional view is observed by a scanning electron microscope (SEM). By this observation, a distance from the outermost surface of the p-GaN epitaxial layer 52 to the n-GaN epitaxial layer 402 is determined.

(f) Next, a SiO₂ film 61 is deposited by CVD method on the p-GaN epitaxial layer 52, which is an uppermost layer of the successive epitaxial layers. Then, the SiO₂ film 61 is patterned by photolithography and RIE to form an etching mask for the formation of the trench in the successive epitaxial layers for forming the cathode electrode as shown in FIG. 6C. An etching condition of the trench for forming the cathode electrode is determined on the basis of the thickness from the p-GaN epitaxial layer 52 to the n-GaN epitaxial layer 402 ascertained by the SEM observation. The RIE is carried out by use of the etching mask of the SiO₂ film 61 until the n-GaN epitaxial layer 402 is exposed as shown in FIG. 6C. The RIE can be carried out using an etching gas such as Cl₂ gas and BCl₃ added Cl₂ gases.

(g) Next, titanium (Ti) of 20 nm in thickness and gold (Au) of 400 nm in thickness are deposited as metal films for the cathode electrode 72 on entire surface of the n-GaN epitaxial layer 402 using the well known vacuum evaporation, sputtering or another method, with the SiO₂ film left as the etching mask. Thereafter, the SiO₂ film 61 is removed using SiO₂ etchant such as NH₄F solution. As the result, the cathode electrode 72 is selectively patterned only on the bottom region of the trench for forming the cathode electrode by the "lift off process" as shown in FIG. 6D. As the metallic materials for cathode electrode 72 onto the n-GaN epitaxial layer 402, a single layer of Al, In, Ti or Au can be used. Further, a laminated structure or an alloy containing Ti and Au is available. Thereafter, a SiO₂ film is newly deposited by CVD method. The new SiO₂ film is delineated to form a region of opening on part thereof, so that the upper portion of the p-GaN epitaxial layer 52 is exposed. Then, nickel (Ni) of 20 nm thick and Au of 400 nm thick are deposited by the vacuum evaporation or sputtering method as the metal films for an anode electrode 71 onto the p-GaN epitaxial layer 52. As the metallic materials for the anode electrode 71 onto the p-GaN epitaxial layer 52, besides Ni/Au laminated structure, a single layer of paradium (Pd), Ti, platinum (Pt) or In can be used. Further, a laminated structure or alloy containing Ni and Au may be available for the anode electrode 71. Thereafter, the SiO₂ film is removed so as to accomplish the lift off process, then the anode electrode 71 is patterned only on part of the top surface of the p-GaN epitaxial layer 52 as shown in FIG. 6D. By a heat treatment at 800° C. for about 5 minutes or at 700° C. for about 20 minutes in nitrogen atmosphere, an excellent ohmic contact characteristics can be obtained for both the cathode electrode 72 and the anode electrode 71.

It was ascertained by measurements of characteristics at 70° C. that the blue-emitting LDs obtained by the method of manufacturing the semiconductor device according to the first embodiment were operated by continuous wave (CW) oscillation under a power load condition of 5 mW. A lifetime test was continued in this state, and the lifetime until the operating current was doubled was measured. The number of test species measured the lifetime was 230 in all and those showed the lifetime of 5000 hours was 212.

On the other hand, the number of the blue-emitting LDs operating with CW oscillation fabricated on a sapphire substrate without using the method of manufacturing the semiconductor device according to the first embodiment is only 30 within a large number of test species. These test species operate in the CW oscillation at room temperature at 5 V and 20 mA but no test species have a lifetime of 5000 hours. Accordingly, it is ascertained that the method of manufacturing the semiconductor device according to the first embodiment provides a noticeable improvement in comparing with the conventional method.

In this way, it can be seen that the operation lifetime of the blue-emitting LD can be noticeably improved by the method of manufacturing the semiconductor device according to the first embodiment. In addition, it is also ascertained that scattering of the device behaviors over the plane of the GaN epitaxial-substrate 401 has not shown any significant disadvantages, resulting in a contribution to high manufacturing yield. A cross section near the MQW active layer 405 was observed by TEM and it was found that within the region observed, there were no potions where indicates the trace of the facet-growth ascribable to the defects as shown in FIG. 1.

First Modification of First Embodiment

Next, a method for manufacturing a semiconductor device according to a modification (first modification) of the first embodiment using the AlGaN/GaN epitaxial-substrate 411 shown in FIG. 4D will be described referring to FIGS. 7A and 7B. The blue-emitting LD according to the first modification of the first embodiment shown in FIG. 7B can be fabricated by the processes similar to the process sequence shown in FIGS. 6A to 6D.

(a) First, the AlGaN/GaN epitaxial-substrate 411 located on a susceptor 33 is heated by RF power radiated from the RF heater 32, while supplying hydrogen, nitrogen and NH₃ gases from a gas introduction tube 31 of the MOCVD equipment shown in FIG. 2B and then the susceptor temperature is controlled to be 1150° C. Next, supply of TMG and SiH₄ gases diluted by hydrogen gas is started and a Si-doped n-GaN epitaxial layer 402 is grown to a thickness of 4 μm on the AlGaN/GaN epitaxial-substrate 411. Thereafter, a Si-doped n-AlGaN epitaxial layer 403 is grown on the n-GaN epitaxial layer 402 to a thickness of 0.8 μm by additionally supplying TMA gas. The supply of TMA gas is stopped and subsequently an n-GaN epitaxial layer 404 is grown to a thickness of 0.1 μm on the n-AlGaN epitaxial layer 403. After the supplies of TMG and SiH₄ gases are stopped, the susceptor temperature is decreased to a stable value of 800° C. Thereafter, two set of TMG and TMI gases are supplied using two set of lines for TMG and TMI gases, respectively, an MQW active layer 405 is deposited. Supplies of TMI and TMG gases are stopped and then the susceptor temperature is returned to 1150° C. After the susceptor temperature is stabilized at 1150° C., a Mg-doped p-AlGaN epitaxial layer 406 is grown to a thickness of 0.04 $\mu$m on the MQW active layer 405 by supplying TMG, TMA and Cp$_2$Mg gases. Subsequently, TMA gas is stopped and a p-GaN epitaxial layer 407 is grown to a thickness of 0.1 $\mu$m on the p-AlGaN epitaxial layer 406. Again, TMA gas is supplied and a p-AlGaN epitaxial layer 408 is grown to a thickness of 0.8 $\mu$m on the p-GaN epitaxial layer 407. Subsequently, a Mg-doped p-GaN epitaxial layer 409 is grown to a thickness of 1 $\mu$m on the p-AlGaN epitaxial layer 408 with the supply of TMA gas is left stopped. Thereafter, at the same time that the supply of Cp$_2$Mg gas is stopped, SiH$_4$ diluted with hydrogen gas is supplied and an n-GaN epitaxial layer 410 is grown to a thickness of 0.1 $\mu$m on the p-GaN epitaxial layer 409. Thereafter, supplies of TMG and SiH$_4$ gas are stopped and power supply to the RF heating coil 32 is stopped. After the susceptor temperature is decreased to 350° C., supply of NH$_3$ gas is stopped. In this way, the multilayered structure is successively grown as shown in FIG. 7A.

Figure 7A:
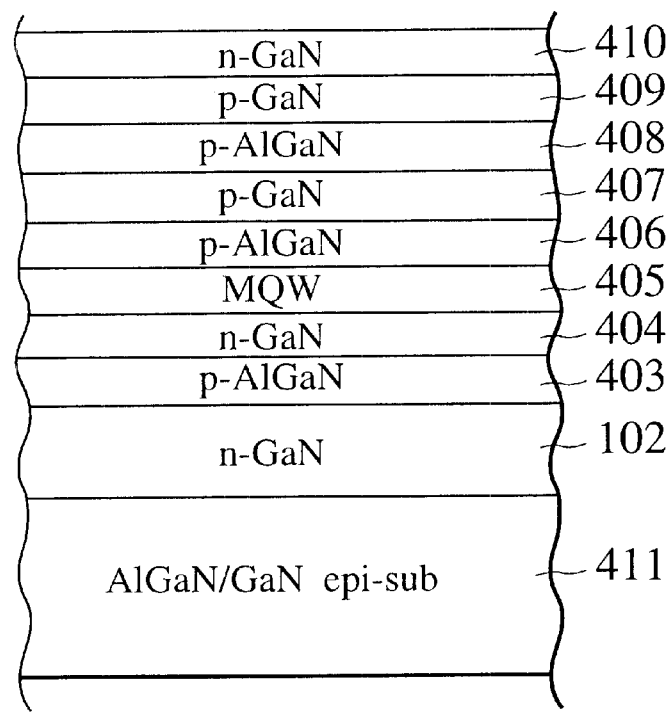
FIGS. 7A and 7B are cross sectional views showing the processes of manufacturing a semiconductor device (semiconductor laser diode) according to a modification (first modification) of the first embodiment of the present invention.

(b) On the multilayered structure shown in FIG. 7A, a SiO$_2$ film is deposited, and the SiO$_2$ film is delineated to form an etching mask for the n-GaN epitaxial layer 410. Using the etching mask (SiO$_2$ mask), the successive epitaxial layers are etched by RIE. The RIE is carried out until a concave region shown in FIG. 7B is formed in the p-GaN epitaxial layer 409 through the n-GaN epitaxial layer 410. The SiO$_2$ mask, which used in the formation of the concave region, is removed by a SiO$_2$ etchant. The AlGaN/GaN epitaxial-substrate 411 having the successive epitaxial layers thereon is again loaded into the MOCVD equipment shown in FIG. 2B. In this time also, the RF heating coil 32 emits RF power while NH$_3$ gas is supplying and the surface treatment is carried out after the temperature is stabilized at 1150° C. At the susceptor temperature of 1150° C., a p-GaN epitaxial layer 51 is grown by supplying TMG and Cp$_2$Mg gases, with the same flow rate of Cp$_2$Mg gas as that for the p-GaN epitaxial layer 409 already grown and the concave region is plugged with the p-GaN epitaxial layer 51 having a thickness of 1 $\mu$m. On the p-GaN epitaxial layer 51, a p-GaN epitaxial layer 52 is grown by abruptly increasing the flow rate of Cp$_2$Mg gas by three factors as shown in FIG. 7B. Thereafter, the supply of TMG gas is stopped and power supply to the RF heating coil 32 is stopped. When the susceptor temperature is decreased to 850° C., the supply of NH$_3$ gas is stopped. After the susceptor temperature is further decreased to nearly room temperature, the AlGaN/GaN epitaxial-substrate 411 is unloaded from the MOCVD equipment. The surface of the p-GaN epitaxial layer 52, the outermost surface of the successive epitaxial layers, is observed in detail by naked eye and an optical microscope. Furthermore, part of a peripheral region of the AlGaN/GaN epitaxial-substrate 411 on which the successive epitaxial layers are stacked is cut and the cross sectional view is observed by a SEM. By this observation, a distance from the outermost surface of the p-GaN epitaxial layer 52 to the n-GaN epitaxial layer 402 is determined.

(c) Next, a SiO$_2$ film 61 is deposited on the p-GaN epitaxial layer 52, which is an uppermost layer of the successive epitaxial layers. Then, the SiO$_2$ film 61 is delineated to form an etching mask for the formation of the trench in the successive epitaxial layers for the cathode electrode as shown in FIG. 7B. An etching condition of the trench for the cathode electrode is determined on the basis of the thickness from the p-GaN epitaxial layer 52 to the n-GaN epitaxial layer 402 ascertained by the SEM observation. The RIE is carried out using the SiO$_2$ film 61 as the etching mask until the n-GaN epitaxial layer 402 is exposed as shown in FIG. 7B. Next, Ti/Au films are deposited as metal films for the cathode electrode 72 on entire surface of the n-GaN epitaxial layer 402, using the SiO$_2$ etching mask as a lift-off mask. Thereafter, the SiO$_2$ film 61 is removed using SiO$_2$ etchant. As the result, the cathode electrode 72 is selectively patterned only on the bottom of the trench for the cathode electrode by the lift off process as shown in FIG. 7B. Thereafter, a SiO$_2$ film is newly deposited. The new SiO$_2$ film is delineated to form an opening on part thereof, so that the upper portion of the p-GaN epitaxial layer 52 is exposed. Then, Ni/Au films are deposited as the metal films for an anode electrode 71 onto the p-GaN epitaxial layer 52.

Figure 7B:
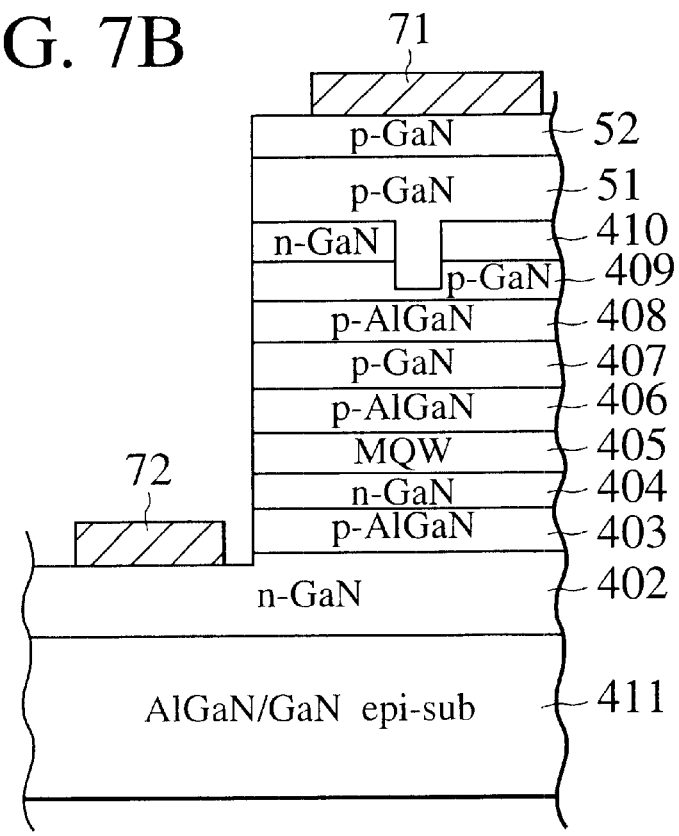

Thereafter, the SiO$_2$ film is removed (lift off), then the anode electrode 71 is patterned only on part of the top surface of the p-GaN epitaxial layer 52 as shown in FIG. 7B. By a heat treatment at 800° C. for about 5 minutes or at 700° C. for about 20 minutes in nitrogen atmosphere, an excellent ohmic contact characteristics can be obtained for both the cathode electrode 72 and the anode electrode 71.

In this way, it can be seen that the operation lifetime of the blue-emitting LD can be noticeably improved by the method of the first modification of the first embodiment. In addition, it is also ascertained that scattering of the device performances over the plane of the AlGaN/GaN epitaxial-substrate 411 has not shown any significant disadvantages, resulting high manufacturing yield. The TEM observed a cross section near the MQW active layer 405 and it was found that within the region observed, there were no traces of the facet-growth ascribable to the defects D shown in FIG. 1.

Second Modification of First Embodiment

Next, a method for manufacturing a semiconductor device according to a modification (second modification) of the first embodiment using the AlGaN epitaxial-substrate 421 shown in FIG. 5B will be described referring to FIGS. 8A and 8B. The blue-emitting LD according to the second modification of the first embodiment shown in FIG. 8B can be fabricated by the processes similar to the process sequence shown in FIGS. 6A to 6D.

(a) First, the AlGaN epitaxial-substrate 421 located on a susceptor 33 is heated by RF power radiated from the RF heater 32, while supplying hydrogen, nitrogen and NH$_3$ gases from a gas introduction tube 31 of the MOCVD equipment shown in FIG. 2B and then the susceptor temperature is controlled to be 1150° C. Next, supply of TMG gas and SiH$_4$ diluted by hydrogen gas is a started and an n-GaN epitaxial layer 402 is grown on the AlGaN epitaxial-substrate 421. Thereafter, an n-AlGaN epitaxial layer 403 is grown on the n-GaN epitaxial layer 402 by additionally supplying TMA gas. The supply of TMA gas is stopped and subsequently an n-GaN epitaxial layer 404 is grown on the n-AlGaN epitaxial layer 403. After the supplies of TMG and SiH$_4$ gases are stopped, the susceptor temperature is decreased to 800° C. Thereafter, two set of TMG and TMI gases are supplied using two sets of lines for TMG and TMI gases, respectively, an MQW active layer 405 is deposited. Supplies of TMI and TMG gases are stopped and then the susceptor temperature is returned to 1150° C. After the susceptor temperature is stabilized at 1150° C., a p-AlGaN epitaxial layer 406 is grown on the MQW active layer 405 by supplying TMG, TMA and Cp$_2$Mg gases. Subsequently, TMA gas is stopped and a p-GaN epitaxial layer 407 is grown on the p-AlGaN epitaxial layer 406. Again, TMA gas is supplied and a p-AlGaN epitaxial layer 408 is grown on the p-GaN epitaxial layer 407. Subsequently, a p-GaN epitaxial layer 409 is grown on the p-AlGaN epitaxial layer 408 with the supply of TMA gas is left stopped. Thereafter, at the same time that the supply of $Cp_2Mg$ gas is stopped, $SiH_4$ diluted with hydrogen gas is supplied and an n-GaN epitaxial layer 410 is grown on the p-GaN epitaxial layer 409. Thereafter, supplies of TMG and $SiH_4$ gas are stopped and power supply to the RF heating coil 32 is stopped. After the susceptor temperature is decreased to 350° C., supply of $NH_3$ gas is stopped. In this way, the multilayered structure is successively grown as shown in FIG. 8A.

Figure 8A:
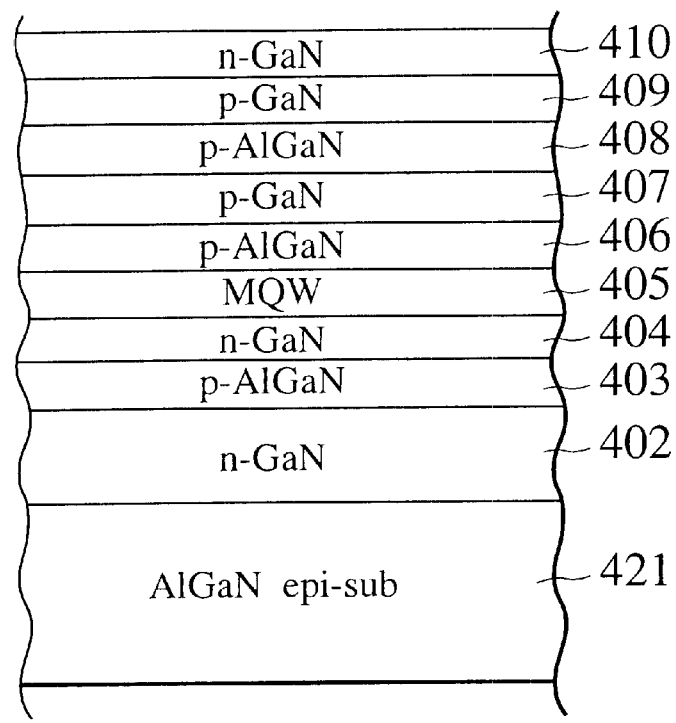
FIGS. 8A and 8B are cross sectional views showing the processes of manufacturing a semiconductor device (semiconductor laser diode) according to another modification (second modification) of the first embodiment of the present invention.
Figure 8B:
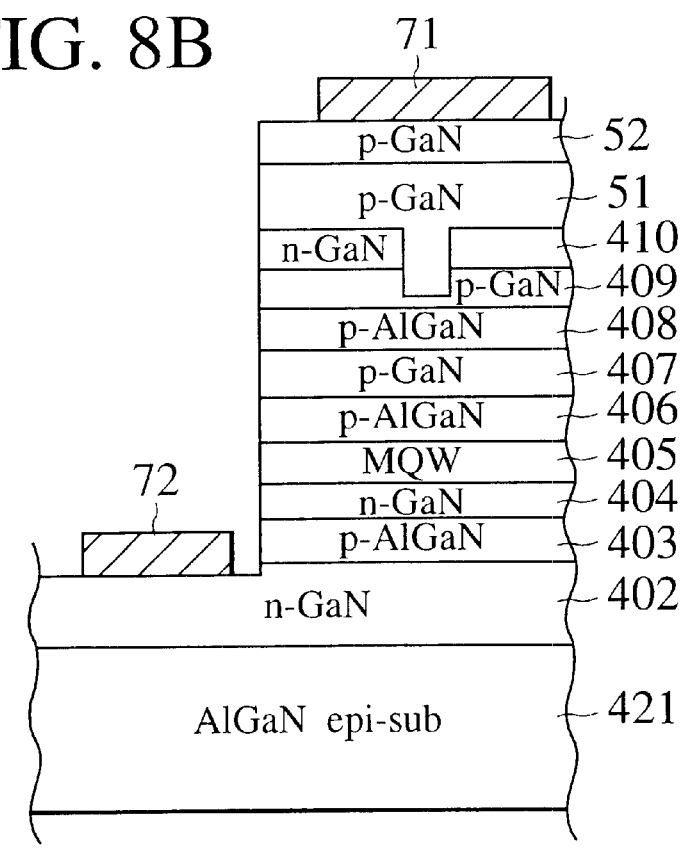

(b) On the multilayered structure shown in FIG. 8A, a $SiO_2$ film is deposited, and the $SiO_2$ film is delineated to form an etching mask for the n-GaN epitaxial layer 410. Using the etching mask ($SiO_2$ mask), the successive epitaxial layers are etched by RIE. The RIE is carried out until a concave shown in FIG. 8B is formed in the p-GaN epitaxial layer 409 through the n-GaN epitaxial layer 410. The $SiO_2$ mask, which used in the formation of the concave, is removed by a $SiO_2$ etchant. The AlGaN epitaxial-substrate 421 is again loaded into the MOCVD equipment shown in FIG. 2B. In this time also, the RF heating coil 32 emits RF power while $NH_3$ gas is supplying and the surface treatment is carried out after the temperature is stabilized at 1150° C. At the susceptor temperature of 1150° C., a p-GaN epitaxial layer 51 is grown by supplying TMG and $Cp_2Mg$ gases, with the same flow rate of $Cp_2Mg$ gas as that for the p-GaN epitaxial layer 409 and the concave is plugged with the p-GaN epitaxial layer 51. On the p-GaN epitaxial layer 51, a p-GaN epitaxial layer 52 is grown by abruptly increasing the flow rate of $Cp_2Mg$ gas by three factors as shown in FIG. 8B. Thereafter, the supply of TMG gas is stopped and power supply to the RF heating coil 32 is stopped. When the susceptor temperature is decreased to 850° C., the supply of $NH_3$ gas is stopped. After the susceptor temperature is further decreased to nearly room temperature, the AlGaN epitaxial-substrate 421 is unloaded from the MOCVD equipment. A part of a peripheral region of the AlGaN epitaxial-substrate 421 on which the successive epitaxial layers are stacked is cut and the cross sectional view is observed by the SEM. By this observation, a distance from the top surface of the p-GaN epitaxial layer 52 to the n-GaN epitaxial layer 402 is determined.

(c) Next, a $SiO_2$ film 61 is deposited on the p-GaN epitaxial layer 52, which is the top layer of the successive epitaxial layers. Then, the $SiO_2$ film 61 is delineated to form an etching mask for the formation of the trench in the successive epitaxial layers for the cathode electrode as shown in FIG. 8B. An etching condition of the trench for the cathode electrode is determined on the basis of the thickness from the p-GaN epitaxial layer 52 to the n-GaN epitaxial layer 402 ascertained by the SEM observation. The RIE is carried out using the $SiO_2$ film 61 as the etching mask until the n-GaN epitaxial layer 402 is exposed as shown in FIG. 8B. Next, Ti/Au films are deposited as metal films for the cathode electrode 72 on entire surface of the n-GaN epitaxial layer 402, using the $SiO_2$ etching mask as a lift-off mask. Thereafter, the $SiO_2$ film 61 is removed. As the result, the cathode electrode 72 is selectively formed only on the bottom of the trench for the cathode electrode by the lift off process as shown in FIG. 8B. Thereafter, a $SiO_2$ film is newly deposited. The new $SiO_2$ film is delineated to form an opening on part thereof, so that the upper portion of the p-GaN epitaxial layer 52 is exposed. Then, Ni/Au films are deposited as the metal films for an anode electrode 71 onto the p-GaN epitaxial layer 52. Thereafter, the $SiO_2$ film is removed, then the anode electrode 71 is delineated only on part of the top surface of the p-GaN epitaxial layer 52 as shown in FIG. 8B. By a heat treatment at 800° C. for about 5 minutes or at 700° C. for about 20 minutes in nitrogen atmosphere, an excellent ohmic contact characteristics can be obtained for both the cathode electrode 72 and the anode electrode 71.

In this way, it can be seen that the operation lifetime of the blue-emitting LD can be noticeably improved by the method of the second modification. In addition, it is also ascertained that scattering of the characteristics over the plane of the AlGaN epitaxial-substrate 421 has not shown any significant disadvantages, resulting high manufacturing yield. The TEM observed a cross section near the MQW active layer 405 and it was found that within the region observed, there were no traces of the facet-growth ascribable to the defects D shown in FIG. 1. Especially, since the lattice mismatching due to the heteroepitaxy is relaxed by using the AlGaN epitaxial-substrate 421, the crystallographic quality is significantly improved to achieve longer lifetime of the blue-emitting LD operation.

Second Embodiment: Method for Manufacturing LD

Figure 9:
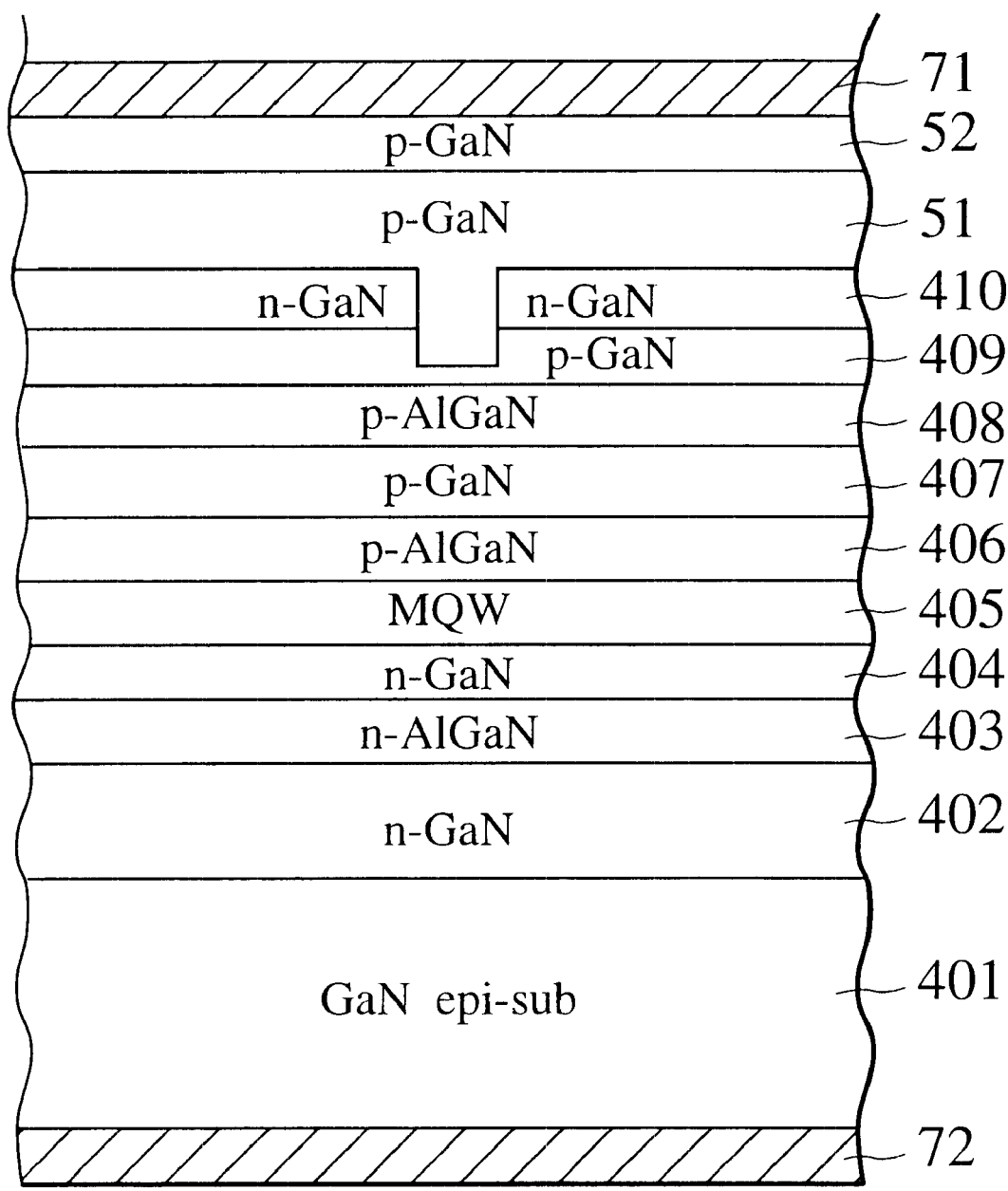
FIG. 9 is a cross sectional view showing a structure of a semiconductor device (semiconductor laser diode) according to second embodiment of the present invention.

FIG. 9 shows a structure of a blue-emitting LD according to second embodiment. A method of manufacturing the semiconductor device of the present invention is characterized in that a low resistivity GaN epitaxial-substrate 401 is used without using an insulating bulk-substrate such as the c plane sapphire substrate 301 as in the conventional method. Accordingly, a cathode electrode 72 such as Ti/Au composite film is made ohmic contact directly to the back surface of the GaN epitaxial-substrate 401 having low resistivity (high impurity concentration) as shown in FIG. 9. The GaN epitaxial-substrate 401 may be prepared by doping Si about $7\times10^{17} cm^{-3}$ to $2\times10^{19} cm^{-3}$ at the epitaxial growth shown in FIG. 3C. On the heavily doped GaN epitaxial-substrate 401, an n-GaN epitaxial layer 402, an n-AlGaN epitaxial layer 403, an n-GaN epitaxial layer 404, an MQW active layer 405, a p-AlGaN epitaxial layer 406, a p-GaN epitaxial layer 407, a p-AlGaN epitaxial layer 408, a p-GaN epitaxial layer 409, an n-GaN epitaxial layer 410, a p-GaN epitaxial layer 51 and a p-GaN epitaxial layer 52 are stacked in this order. A concave region penetrating through the n-GaN epitaxial layer 410 and reaching to the p-GaN epitaxial layer 409 is formed to divide the n-GaN epitaxial layer 410 into two regions which constitute a current blocking layer. Thus, the current flows only through the current channel encompassed by the concave region of the p-GaN epitaxial layer 409, so that the blue-emitting LD emits blue light beam effectively from the MQW active layer 405. The carriers are confined by a DH structure wherein the MQW active layer 405 is inserted between the clad layers of the n-AlGaN epitaxial layer 403 and the p-AlGaN epitaxial layer 408. The uppermost p-GaN epitaxial layer 52 is a highly doped ohmic contact layer and the anode electrode 71 such as Ni/Au composite film is formed thereon to serve as an ohmic electrode. Differently to FIG. 6D, the trench for forming the cathode electrode from the p-GaN epitaxial layer 52 to the n-GaN epitaxial layer 402 is not needed. Consequently, the formation processes of the mask 61 for etching and the RIE method used thereof as mentioned above are omitted so that the fabrication process is simplified. Only one micro bonding per element is needed, as the cathode electrode 72 is formed directly on the back of the highly doped GaN epitaxial-substrate 401, and hence the assembly process is greatly simplified. As there is only one contact region for forming the electrode on the upper surface of the stacked structure, realization of the integration circuit with higher and higher packing density is easy.

Further, the cathode electrode 72 such as Ti/Au composite film can be contact directly with the back surface of the AlGaN/GaN epitaxial-substrate 411 or the AlGaN epitaxial-substrate 421 having lower resistivity (higher impurity concentration) so as to form an excellent ohmic contact, thereby providing higher performance blue-emitting LD. The lower resistivity AlGaN/GaN epitaxial-substrate 411 or the AlGaN epitaxial-substrate 421 may be prepared by doping Si about $7 \times 10^{17} cm^{-3}$ to $2 \times 10^{19} cm^{-3}$ at the epitaxial growth stage to obtain the stacked structure shown in FIG. 4C or 5A.

Third Embodiment: Method of Manufacturing LED

A method of manufacturing the blue-emitting LD has been described in the description of the first and second embodiments. However, the present invention is not limited only to the method of manufacturing the blue-emitting LD. In third embodiment of the present invention, a method of manufacturing a blue-emitting LED will be described. In the method of manufacturing the blue-emitting LED according to the third embodiment is based on a methodology wherein the required semiconductor layers are successively grown epitaxially by the MOCVD method on the GaN epitaxial-substrate 401 prepared by the method shown in FIGS. 3C to 3E.

(a) First, the GaN epitaxial-substrate 401 of the present invention is prepared by the method as shown in FIGS. 3C to 3E. On the GaN epitaxial-substrate 401, an n-GaN epitaxial layer 402, an n-AlGaN epitaxial layer 403, an n-GaN epitaxial layer 404, an MQW active layer 405, a p-AlGaN epitaxial layer 406, a p-GaN epitaxial layer 407, a p-AlGaN epitaxial layer 408 and a p-GaN epitaxial layer 409 are successively stacked in this order as shown in FIG. 6A by the MOCVD equipment shown in FIG. 2B. It differs from the method manufacturing the blue-emitting LD described above in that the successive epitaxial growth is terminated without growing further an n-GaN epitaxial layer 410 on the p-GaN epitaxial layer 409. That is, after the GaN epitaxial layer 409 is grown to a required thickness, the supply of TMG gas is stopped simultaneously with the stop of power supply to the RF heating coil 32. When the susceptor temperature is decreased to 850° C., a supply of $NH_3$ gas is stopped. After the susceptor temperature is decreased further to near room temperature, the GaN epitaxial-substrate 401 whereon the successive epitaxial layers are stacked is unloaded from the MOCVD equipment. Then, similarly to the first embodiment, part of a peripheral portion of the GaN epitaxial-substrate 401 whereon the successive epitaxial layers are stacked is cut and observed with SEM. By the cross sectional SEM observation, the distance from the top surface of the p-GaN epitaxial layer 409 to the n-GaN epitaxial layer 402 is determined.

(b) Next, a transparent electrode layer, serving as an anode electrode is formed on the p-GaN epitaxial layer 409 which is a top layer of the successive epitaxial layers, because light is emitted from the p-GaN epitaxial layer 409 in a direction perpendicular thereto. Specifically, a metal oxide film such as a film of Sn-doped indium oxide ($InO_2$) film referred as ITO (indium-tin-oxide) film, tin oxide ($SnO_2$) film is deposited by CVD, vacuum evaporation, sputtering or another method. Otherwise, a metal film such as Au made sufficiently thin to about 5 nm can be used as a transparent electrode. An etching mask made of $SiO_2$ film is formed on the transparent electrode. Then, the transparent electrode is patterned using the $SiO_2$ mask by RIE. Further, a trench for forming the cathode electrode is excavated to expose the n-GaN epitaxial layer 402, with reference to the thickness from the p-GaN epitaxial layer 409 to the n-GaN epitaxial layer 402 determined by the cross sectional observation A with SEM, using a multilayered etching mask composed of the $SiO_2$ film and the transparent electrode layer.

(c) Next, a Ti/Au film is deposited over an entire surface of the n-GaN epitaxial layer 402 as a metal film of the cathode electrode by the vacuum evaporation, sputtering or another method, without removing the etching mask. The cathode electrode is not necessary to be transparent. Thereafter, the $SiO_2$ film is removed by the $SiO_2$ etchant such as a $NH_4F$ solution so as to accomplish the lift off process. As a result, the cathode electrode is delineated selectively only on a bottom region of the trench for forming the cathode electrode. Thereafter, an anode electrode bonding pad region such as Ni/Au or Al film in the frame-shape is formed on a peripheral region of the transparent electrode layer serving as an anode electrode. Then, a good ohmic characteristics can be obtained for both cathode and anode electrodes by heat treatment at 800° C. for about 5 minutes or at 700° C. for about 20 minutes in nitrogen atmosphere.

Thereafter, the multilayered structure having the cathode and anode electrodes is cut into chips of 300 μm square, mounted on a required stem (package) and is bonded to the cathode and anode electrodes so that the blue-emitting LED is completed. Measurements of the emission characteristics of the blue-emitting LED showed a peak wavelength of 480 nm and an output of 15 mW at 20 mA. The output obtained is more than 60 times of that obtained by a blue-emitting LED fabricated by the method using the conventional sapphire substrate for MOCVD.

As mentioned previously, a feature of the method of manufacturing the semiconductor device of the present invention lies in that the GaN epitaxial-substrate 401 with low resistivity can be used without using the insulating bulk-substrate. Consequently, the ohmic cathode electrode 72 can contact directly to the back surface of the GaN epitaxial-substrate 401 having high impurity concentration for implementing the blue-emitting LED of the third embodiment similarly to FIG. 9. An opposite electrode type blue-emitting LED is completed by forming the anode electrode to make the ohmic contact to the p-GaN epitaxial layer 409 in a structure wherein the n-GaN epitaxial layer 402, the n-AlGaN epitaxial layer 403, the n-GaN epitaxial layer 404, the MQ active layer 405, the p-AlGaN epitaxial layer 406, the p-GaN epitaxial layer 407, the p-AlGaN epitaxial layer 408 and the p-GaN epitaxial layer 409 are stacked in this order on the GaN epitaxial-substrate 401 having high impurity concentration. That is, the trench for forming the cathode electrode protruding from the top p-GaN epitaxial layer 409 to the n-GaN epitaxial layer 402 is not needed. Consequently, the process of forming the etching mask for the trench for forming the cathode electrode and the process of RIE using this etching mask can be omitted so that the fabrication process is simplified. As the trench for forming the cathode electrode is not formed, the effective emission area is increased correspondingly, resulting in a high luminescence. In addition, as the cathode electrode 72 is formed directly on the back surface of the GaN epitaxial-substrate 401 having high impurity concentration, only one wire bonding is needed per element so that the assembly process is simplified. As there is only one contact portion on the upper surface of the stacked structure for forming the upper electrode, realization of high degree of on-chip integration is easy.

Further, instead of the GaN epitaxial-substrate 401, the AlGaN/GaN epitaxial-substrate 411 or the AlGaN epitaxial-substrate 421 can also be used so as to stack thereon the multi-layered structure serving as the body for the blue-emitting LED.

Other Embodiments

Various modifications will become possible for those skilled in the art after receiving the teaching of the present disclosure without departing from the scope thereof.

That is, the method of manufacturing the semiconductor device of the present invention is not limited to the semiconductor light-emitting device such as the blue-emitting LD and LED described above. For example, HEMT, MESFET and another electronic devices can be fabricated by stacking required semiconductor multilayered structures successively with the epitaxial growth using the MOCVD method on the GaN epitaxial-substrate 401, the AlGaN/GaN epitaxial-substrate 411 or the AlGaN epitaxial-substrate 421 prepared by the method of the present invention shown in FIGS. 3A–3E, 4A–4D or 5A–5B. In this case, the HEMT using a GaN/AlN heterojunction can be constructed by depositing a AlN epitaxial layer of 40 nm in thickness, a GaN epitaxial layer of 3 μm in thickness, a AlN epitaxial layer of 6 nm thickness and a GaN epitaxial layer between 100 nm and 250 nm in thickness on the GaN epitaxial-substrate 401, the AlGaN/GaN epitaxial-substrate 411 or the AlGaN epitaxial-substrate 421 described above in this order and forming source and drain electrodes made of Ti/Al composite layer and a gate electrode made of Au, Pt/Au or Al layer on the uppermost GaN epitaxial layer. The HEMT using a GaN/AlGaN heterojunction can also be constructed. These HEMTs fabricated using the epitaxial-substrates 401 of the present invention have high mobility owing to an excellent crystallographic quality of the channel layer, so that have higher conversion conductance $g_m$.

A MISFET is completed by depositing a AlN epitaxial layer of 40 nm in thickness, a GaN epitaxial layer of 3 μm in thickness, an AlN epitaxial layer of 6 nm in thickness, and a GaN epitaxial layer between 100 nm and 250 nm in thickness in this order on the GaN epitaxial-substrate 401, the AlGaN/GaN epitaxial-substrate 411 or the AlGaN epitaxial-substrate 421 of the present invention described above, depositing a silicon nitride film ($Si_3N_4$ film) of 80 nm in thickness on the uppermost GaN epitaxial layer, using this $Si_3N_4$ film as a gate insulating film and forming thereon a gate electrode made of metal such as Al. Then, source and drain electrodes made of Ti/Al composite films are formed on the GaN epitaxial layer. The MISFET fabricated on the GaN epitaxial-substrate 401, the AlGaN/GaN epitaxial-substrate 411 or the AlGaN epitaxial-substrate 421 of the present invention has a high mobility of the channel layer, and therefore has a high conversion conductance $g_m$.

Otherwise, a GaN base region and a AlGaN emitter region disposed on the GaN base region can be stacked successively by the MOCVD method on the low resistivity AlGaN epitaxial-substrate 421 so as to provide an AlGaN/GaN heterojunction HBT. Or, the multilayered structure having the GaN base region and the AlGaN emitter region can be stacked successively on the low resistivity GaN epitaxial-substrate 401 so as to provide the AlGaN/GaN heterojunction HBT. In these HBT, the collector electrode can be directly contacted to the bottom surface of the AlGaN epitaxial-substrate 421 or the GaN epitaxial-substrate 401, so as to achieve lower ohmic contact. In such the HBT, a high current amplification factor $h_{FE}$ can be obtained owing to the excellent crystallographic quality, and therefore high power and high frequency output element can be easily obtained. Thus, the present invention of course includes various embodiments and modifications and the like, which are not detailed above. Therefore, the scope of the present invention will be defined in the following claims.

What is claimed is:

1. A method comprising
   growing a first GaN based semiconductor layer on a bulk-substrate;
   growing an InGaN based semiconductor layer on the first GaN based semiconductor layer;
   growing a second GaN based semiconductor layer on the InGaN based semiconductor layer; and
   separating the second GaN based semiconductor layer from the first GaN based semiconductor layer by removing at least a part of the InGaN layer to provide an epitaxial-substrate having the second GaN based semiconductor layer.

2. The method of claim 1, wherein removing includes gas etching and an etching rate for the second GaN based semiconductor layer is lower than an etching rate for the InGaN based semiconductor layer.

3. The method of claim 1, wherein the second GaN based semiconductor layer is an AlGaN based semiconductor layer.

4. The method of claim 1, further comprising
   growing a third GaN based semiconductor layer on the second GaN based semiconductor layer,
   wherein removing includes gas etching and an etching rate for the third GaN based semiconductor layer is lower than an etching rate for the InGaN based semiconductor layer.

5. The method of claim 4, wherein the third GaN based semiconductor layer is an AlGaN based semiconductor layer.

6. The method of claim 4, wherein said growing the first GaN based semiconductor layer, said growing the InGaN based semiconductor layer, said growing the second GaN based semiconductor layer, said growing the third GaN based semiconductor layer and said gas etching are executed in one reaction chamber.

7. The method of claim 4, wherein the etching rate by gas etching for the third GaN based semiconductor layer is lower than an etching rate for the second GaN based semiconductor layer.

8. The method of claim 4, wherein said gas etching is executed by introducing a hydrogen gas into one reaction chamber wherein the third GaN based semiconductor layer is grown, at a substrate temperature higher than room temperature and lower than the substrate temperature at which the third GaN based semiconductor layer is grown.

9. The method of claim 4, wherein said gas etching is executed in one reaction chamber wherein the second GaN based semiconductor layer is grown.

10. The method of claim 4, wherein said gas etching is executed by introducing a hydrogen gas into one reaction chamber wherein the second GaN based semiconductor layer is grown, at a substrate temperature higher than room temperature and lower than the substrate temperature at which the second GaN based semiconductor layer is grown.

11. The method of claim 4, wherein said gas etching is executed in one reaction chamber wherein the third GaN based semiconductor layer is grown.

12. The method of claim 1, wherein said growing the first GaN based semiconductor layer, said growing the InGaN based semiconductor layer, said growing the second GaN based semiconductor layer and said removing are executed in one reaction chamber.

13. The method of claim 1, wherein removing comprises selectively etching at least part of the InGaN based semiconductor layer by gas etching.

14. The method of claim 1, wherein a gaseous metalorganic compound is a gallium source for growing the first GaN based semiconductor layer, and a halogen compound of metallic gallium is a gallium source for growing the second GaN based semiconductor layer.

15. A method comprising growing a first GaN based semiconductor layer on a bulk-substrate;

growing an InGaN based semiconductor layer on the first GaN based semiconductor layer;

growing a second GaN based semiconductor layer on the InGaN based semiconductor layer;

growing a third GaN based semiconductor layer on the second GaN based semiconductor layer, selectively removing at least part of the InGaN based semiconductor layer in one reaction chamber wherein the third GaN based semiconductor layer is grown at a substrate temperature higher than room temperature and lower than the substrate temperature at which the third GaN based semiconductor layer is grown so as to form a slit between the first and second GaN based semiconductor layer; and exfoliating a stacked structure comprising the second and third GaN based semiconductor layers from the first GaN based semiconductor layer by a stress due to a thermal strain at a portion in the InGaN based semiconductor layer by lowering the substrate temperature to the room temperature to separate the second GaN based semiconductor layer from the first GaN based semiconductor layer to provide an epitaxial-substrate having the second GaN based semiconductor layer.

16. The method of claim 15, wherein removing includes gas etching.

17. A method comprising growing a first GaN based semiconductor layer on a bulk-substrate;

growing an InGaN based semiconductor layer on the first GaN based semiconductor layer;

growing a second GaN based semiconductor layer on the InGaN based semiconductor layer; and selectively removing at least part of the InGaN based semiconductor layer in one reaction chamber wherein the second GaN based semiconductor layer is grown at a substrate temperature higher than room temperature and lower than the substrate temperature at which the second GaN based semiconductor layer is grown so as to form a slit between the first and second GaN based semiconductor layer; and exfoliating the second GaN based semiconductor layer from the first GaN based semiconductor layer by a stress due to a thermal strain at a portion in the InGaN based semiconductor layer by lowering the substrate temperature to the room temperature to separate the second GaN based semiconductor layer from the first GaN based semiconductor layer to provide an epitaxial-substrate having the second GaN based semiconductor layer.

18. The method of claim 17, wherein removing includes gas etching.

19. A method comprising growing a first GaN based semiconductor layer on a bulk-substrate;

growing an InGaN based semiconductor layer on the first GaN based semiconductor layer;

growing a second GaN based semiconductor layer on the InGaN based semiconductor layer;

separating the second GaN based semiconductor layer from the first GaN based semiconductor layer by removing at least a part of the InGaN layer to provide an epitaxial-substrate having the second GaN based semiconductor layer;

growing a multilayered structure of GaN based semiconductor layers on the epitaxial-substrate; and forming an electrode on a top layer of the multilayered structure.

20. The method of claim 19, wherein a gaseous metalorganic compound is a gallium source for growing the first GaN based semiconductor layer and a halide of metallic gallium is a gallium source for growing the second GaN based semiconductor layer.

21. The method of claim 19, further comprising growing a third GaN based semiconductor layer on the second GaN based semiconductor layer, wherein removing includes gas etching and an etching rate for the third GaN based semiconductor layer is lower than the etching rate for the InGaN based semiconductor layer.

22. The method of claim 19, wherein removing includes gas etching.

23. A method comprising growing a first GaN based semiconductor layer on a bulk-substrate;

growing an InGaN based semiconductor layer on the first GaN based semiconductor layer;

growing a second GaN based semiconductor layer on the InGaN based semiconductor layer; and removing selectively at least part of the InGaN based semiconductor layer; and exfoliating the second GaN based semiconductor layer from the first GaN based semiconductor layer by a stress due to a thermal strain at a portion in the InGaN based semiconductor layer to separate the second GaN based semiconductor layer from the first GaN based semiconductor layer to provide an epitaxial-substrate having the second GaN based semiconductor layer.

24. The method of claim 23, wherein removing includes gas etching.

* * * * *